(12) United States Patent
Lu et al.

(10) Patent No.: US 10,256,137 B2
(45) Date of Patent: Apr. 9, 2019

(54) SELF-ALIGNED TRENCH ISOLATION IN INTEGRATED CIRCUITS

(71) Applicant: Cypress Semiconductor Corporation, San Jose, CA (US)

(72) Inventors: Ching-Huang Lu, Fremont, CA (US); Lei Xue, Saratoga, CA (US); Kenichi Ohtsuka, Sunnyvale, CA (US); Simon Siu-Sing Chan, Saratoga, CA (US); Rinji Sugino, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/802,721

(22) Filed: Nov. 3, 2017

(65) Prior Publication Data
US 2018/0166323 A1 Jun. 14, 2018

Related U.S. Application Data

(63) Continuation of application No. 15/191,882, filed on Jun. 24, 2016, now Pat. No. 9,831,114, which is a
(Continued)

(51) Int. Cl.
*H01L 21/762* (2006.01)
*H01L 21/8234* (2006.01)
(Continued)

(52) U.S. Cl.
CPC .. *H01L 21/76237* (2013.01); *H01L 21/76224* (2013.01); *H01L 21/8234* (2013.01);
(Continued)

(58) Field of Classification Search
CPC ......... H01L 21/76237; H01L 29/66484; H01L 21/76224; H01L 29/0653; H01L 29/66833;
(Continued)

(56) References Cited

U.S. PATENT DOCUMENTS 4,918,027 A 4/1990 Fuse et al.
4,939,567 A 7/1990 Kenney
(Continued)

OTHER PUBLICATIONS

Sato, T. et al., "SON (Silicon on Nothing) MOSFET using ESS (Empty Space in Silicon) technique for SoC applications," Electron Devices Meeting, 2001. IEDM '01. Technical Digest. International, IEEE, United States (2001); 4 pages.
(Continued)

*Primary Examiner* — Asok K Sarkar
*Assistant Examiner* — Grant S Withers

(57) ABSTRACT

An A method for fabricating an integrated circuit (IC) comprising a substrate, a first device, a second device, and a trench in the substrate is described herein. The trench is self-aligned between the first and second devices and comprises a first portion filled with a dielectric material and a second portion filled with a conductive material. The self-aligned placement of the trench provides electrical isolation between the first and second devices and allows for higher packing density without negatively affecting the operation of closely spaced devices in a high density IC.

3 Claims, 14 Drawing Sheets

Related U.S. Application Data continuation of application No. 14/048,863, filed on Oct. 8, 2013, now Pat. No. 9,437,470.

(51) Int. Cl.

| | |
|---|---|
| *H01L 29/06* | (2006.01) |
| *H01L 29/66* | (2006.01) |
| *H01L 29/788* | (2006.01) |
| *H01L 29/792* | (2006.01) |
| *H01L 27/11521* | (2017.01) |
| *H01L 27/11568* | (2017.01) |

(52) U.S. Cl.
CPC .. *H01L 21/823481* (2013.01); *H01L 29/0638* (2013.01); *H01L 29/0653* (2013.01); *H01L 29/66484* (2013.01); *H01L 29/66537* (2013.01); *H01L 29/66825* (2013.01); *H01L 29/66833* (2013.01); *H01L 29/7881* (2013.01); *H01L 29/792* (2013.01); *H01L 27/11521* (2013.01); *H01L 27/11568* (2013.01)

(58) Field of Classification Search
CPC ............. H01L 29/66825; H01L 29/792; H01L 29/7881; H01L 29/0638; H01L 29/66537
See application file for complete search history.

(56) References Cited

U.S. PATENT DOCUMENTS

| | | | |
|---|---|---|---|
| 4,980,306 A | 12/1990 | Shimbo | |
| 5,349,224 A | 9/1994 | Gilbert et al. | |
| 5,573,969 A | 11/1996 | Kim | |
| 5,851,881 A | 12/1998 | Lin et al. | |
| 6,051,868 A | 4/2000 | Watanabe et al. | |
| 6,090,661 A | 7/2000 | Perng et al. | |
| 6,091,129 A | 7/2000 | Cleeves | |
| 6,177,699 B1 | 1/2001 | Perng et al. | |
| 6,268,637 B1 | 7/2001 | Gardner et al. | |
| 6,285,066 B1 | 9/2001 | Meyer | |
| 6,344,399 B1 | 2/2002 | Noble | |
| 6,348,366 B2 | 2/2002 | Noble | |
| 6,420,749 B1 | 7/2002 | Divakaruni et al. | |
| 6,570,217 B1 | 5/2003 | Sato et al. | |
| 6,720,638 B2 | 4/2004 | Tran | |
| 6,884,687 B2 | 4/2005 | Noble | |
| 6,898,851 B2 | 5/2005 | Nishioka et al. | |
| 6,998,694 B2 | 2/2006 | Wu | |
| 7,009,273 B2 | 3/2006 | Inoh et al. | |
| 7,019,364 B1 | 3/2006 | Sato et al. | |
| 7,019,365 B2 | 3/2006 | Sato et al. | |
| 7,145,215 B2 | 12/2006 | Inoh et al. | |
| 7,235,456 B2 | 6/2007 | Sato et al. | |
| 7,335,944 B2 | 2/2008 | Banerjee et al. | |
| 7,372,086 B2 | 5/2008 | Sato et al. | |
| 7,420,249 B2 | 9/2008 | Sato et al. | |
| 7,507,634 B2 | 3/2009 | Sato et al. | |
| 7,704,854 B2 * | 4/2010 | Dennard ........... | H01L 21/76283 257/E21.54 |
| 7,741,143 B2 | 6/2010 | Paik et al. | |
| 7,767,528 B2 | 8/2010 | Muller et al. | |
| 8,975,684 B2 | 3/2015 | Sim et al. | |
| 9,159,791 B2 | 10/2015 | Chen et al. | |
| 9,219,115 B2 | 12/2015 | Colinge | |
| 9,437,470 B2 | 9/2016 | Lu et al. | |
| 2001/0035561 A1 | 11/2001 | Hirler et al. | |
| 2002/0030223 A1 * | 3/2002 | Narita ............... | H01L 21/76224 257/314 |
| 2002/0048886 A1 | 4/2002 | Nakamura | |
| 2003/0089961 A1 | 5/2003 | Vollrath et al. | |
| 2003/0124803 A1 | 7/2003 | Ueda et al. | |
| 2003/0216032 A1 | 11/2003 | Nejad et al. | |
| 2004/0129995 A1 | 7/2004 | Yeo et al. | |
| 2004/0173844 A1 | 9/2004 | Williams et al. | |
| 2005/0006706 A1 | 1/2005 | Stefanov et al. | |
| 2005/0186748 A1 | 8/2005 | Hasumi et al. | |
| 2005/0253183 A1 | 11/2005 | Umezawa et al. | |
| 2005/0258463 A1 | 11/2005 | Yaegashi et al. | |
| 2006/0138549 A1 | 6/2006 | Ko | |
| 2006/0148177 A1 * | 7/2006 | Kim ...................... | H01L 27/115 438/267 |
| 2006/0231883 A1 * | 10/2006 | Nansei .............. | H01L 21/28282 257/314 |
| 2006/0246657 A1 * | 11/2006 | Kim .................. | H01L 21/76224 438/243 |
| 2007/0161187 A1 * | 7/2007 | Hwang ................. | H01L 27/105 438/257 |
| 2008/0003749 A1 | 1/2008 | Lee | |
| 2008/0017929 A1 | 1/2008 | Yi | |
| 2008/0029817 A1 | 2/2008 | Barlocchi et al. | |
| 2008/0224234 A1 | 9/2008 | Sasaki | |
| 2009/0029523 A1 | 1/2009 | Seo et al. | |
| 2009/0159987 A1 | 6/2009 | Oh | |
| 2009/0162989 A1 | 6/2009 | Cho et al. | |
| 2009/0170282 A1 | 7/2009 | Dong | |
| 2009/0218619 A1 * | 9/2009 | Hebert ................ | H01L 29/0619 257/332 |
| 2009/0230456 A1 * | 9/2009 | Yoon ............... | H01L 21/823456 257/321 |
| 2009/0321794 A1 | 12/2009 | Kim et al. | |
| 2010/0047994 A1 * | 2/2010 | Dong ................. | H01L 21/76224 438/421 |
| 2010/0163992 A1 | 7/2010 | Kim | |
| 2011/0039383 A1 | 2/2011 | Chen et al. | |
| 2011/0127650 A1 | 6/2011 | Witvrouw et al. | |
| 2011/0159659 A1 | 6/2011 | Chiu et al. | |
| 2011/0198700 A1 | 8/2011 | Park et al. | |
| 2011/0227191 A1 | 9/2011 | Disney | |
| 2012/0205777 A1 | 8/2012 | Lee | |
| 2013/0095636 A1 | 4/2013 | Dutartre et al. | |
| 2013/0234279 A1 | 9/2013 | Kim et al. | |
| 2013/0322189 A1 | 12/2013 | Chen | |
| 2014/0011334 A1 | 1/2014 | Cho et al. | |
| 2015/0008530 A1 | 1/2015 | Park et al. | |
| 2015/0014807 A1 | 1/2015 | Chuang et al. | |
| 2015/0097224 A1 | 4/2015 | Xue et al. | |
| 2015/0097245 A1 | 4/2015 | Lu et al. | |
| 2015/0099342 A1 | 4/2015 | Tsai et al. | |
| 2015/0179734 A1 | 6/2015 | Guowei et al. | |
| 2016/0043217 A1 | 2/2016 | Cai | |

OTHER PUBLICATIONS

USPTO Advisory Action for U.S. Appl. No. 14/048,527 dated Jun. 15, 2016; 3 pages.
USPTO Advisory Action for U.S. Appl. No. 14/048,527 dated Sep. 16, 2015; 6 pages.
USPTO Advisory Action for U.S. Appl. No. 14/048,863 dated Oct. 22, 2015; 3 pages.
USPTO Advisory Action for U.S. Appl. No. 15/012,644 dated Apr. 11, 2017; 2 pages.
USPTO Advisory Action for U.S. Appl. No. 15/012,644 dated Sep. 29, 2017; 5 pages.
USPTO Applicant Initiated Interview Summary for U.S. Appl. No. 14/048,527 dated Sep. 16, 2015; 3 page.
USPTO Final Rejection for U.S. Appl. No. 14/048,527 dated Mar. 28, 2016; 11 pages.
USPTO Final Rejection for U.S. Appl. No. 14/048,527 dated Jul. 7, 2015; 15 pages.
USPTO Final Rejection for U.S. Appl. No. 14/048,527 dated Nov. 28, 2016; 19 pages.
USPTO Final Rejection for U.S. Appl. No. 14/0848,863 dated Aug. 11, 2015; 11 pages.
USPTO Final Rejection for U.S. Appl. No. 15/012,644 dated Jan. 30, 2017; 8 pages.
USPTO Final Rejection for U.S. Appl. No. 15/012,644 dated Jul. 27, 2017; 12 pages.
USPTO Non-Final Rejection for U.S. Appl. No. 14/048,527 dated Jan. 22, 2015; 11 pages.
USPTO Non-Final Rejection for U.S. Appl. No. 14/048,527 dated Aug. 18, 2016; 17 pages.

(56) References Cited

OTHER PUBLICATIONS

USPTO Non-Final Rejection for U.S. Appl. No. 14/048,527 dated Nov. 16, 2015; 12 pages.
USPTO Non-Final Rejection for U.S. Appl. No. 14/048,863 dated Mar. 30, 2015; 9 pages.
USPTO Non-Final Rejection for U.S. Appl. No. 14/207,303 dated Jul. 8, 2015; 6 pages.
USPTO Non-Final Rejection for U.S. Appl. No. 15/012,644 dated May 19, 2017; 9 pages.
USPTO Non-Final Rejection for U.S. Appl. No. 15/012,644 dated Oct. 11, 2016; 8 pages.
USPTO Notice of Allowance for U.S. Appl. No. 14/048,863 dated Jan. 15, 2016; 9 pages.
USPTO Notice of Allowance for U.S. Appl. No. 14/048,863 dated May 6, 2016; 9 pages.
USPTO Notice of Allowance for U.S. Appl. No. 14/207,303 dated Sep. 24, 2015; 7 pages.
USPTO Notice of Allowance for U.S. Appl. No. 15/191,882 dated Mar. 1, 2017; 12 pages.
USPTO Notice of Allowance for U.S. Appl. No. 15/191,882 dated Jul. 6, 2017; 13 pages.
USPTO Notice of Allowance for U.S. Appl. No. 15/191,882 dated Oct. 3, 2016; 13 pages.
USPTO Notice of Requirement for Restriction/Election for U.S. Appl. No. 14/207,303 dated Mar. 31, 2015; 6 pages.
USPTO Requirement for Restriction/Election for U.S. Appl. No. 14/048,527 dated Sep. 5, 2014; 7 pages.
USPTO Requirement for Restriction/Election for U.S. Appl. No. 14/048,863 dated Nov. 13, 2014; 9 pages.
USPTO Non-Final Rejection for U.S. Appl. No. 15/012,644 dated Apr. 27, 2018; 13 pages.

* cited by examiner

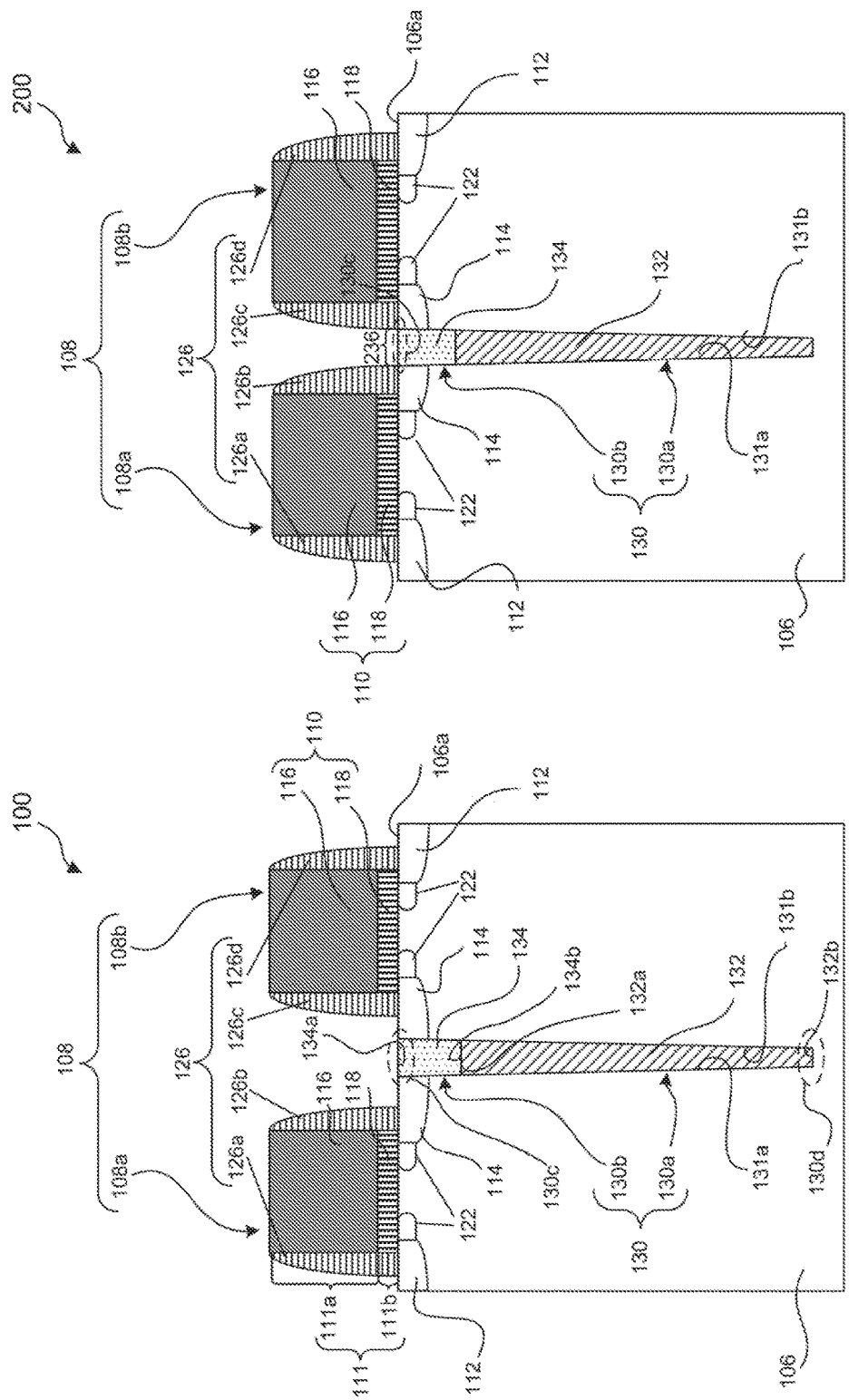

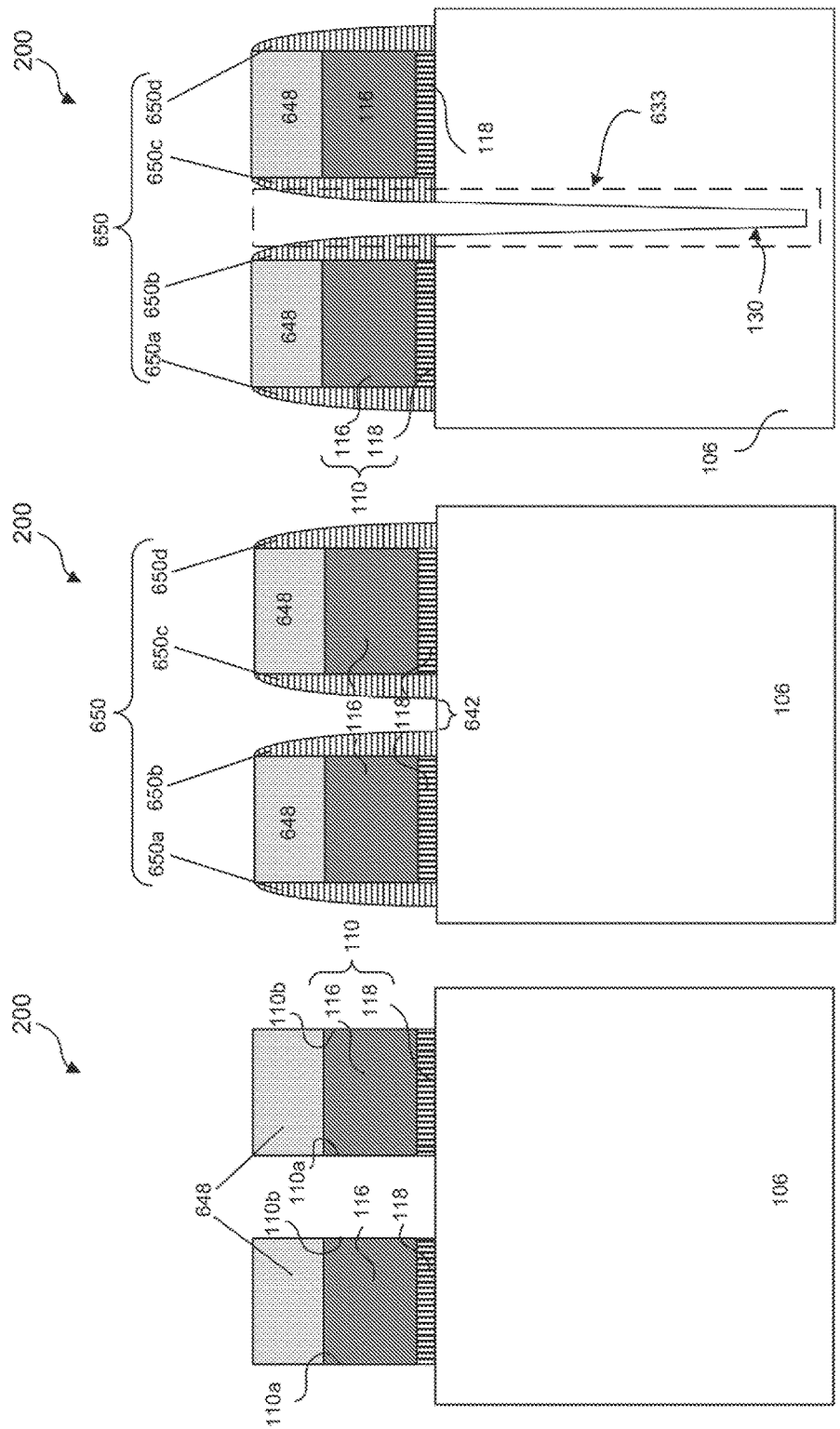

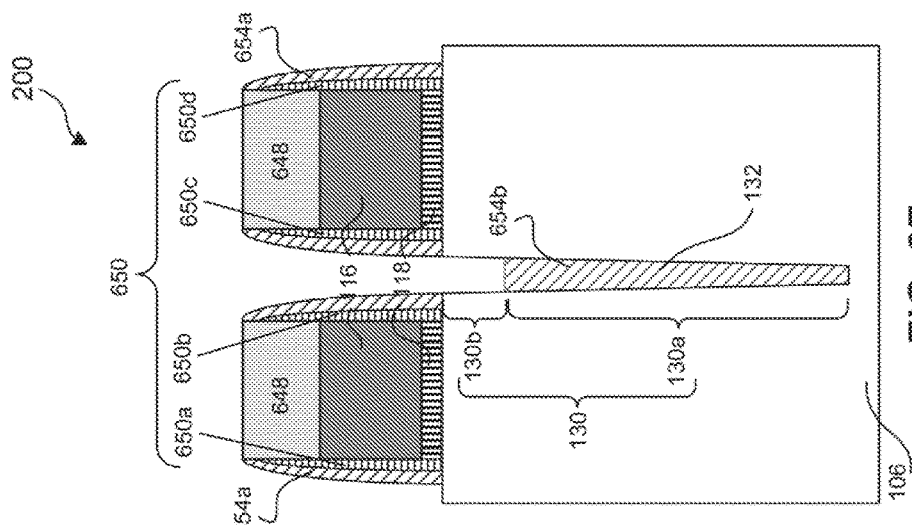

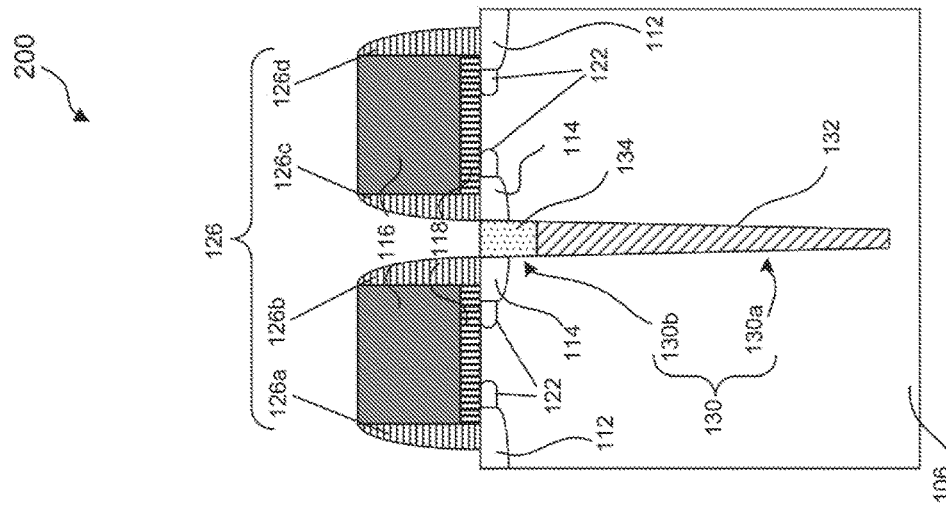
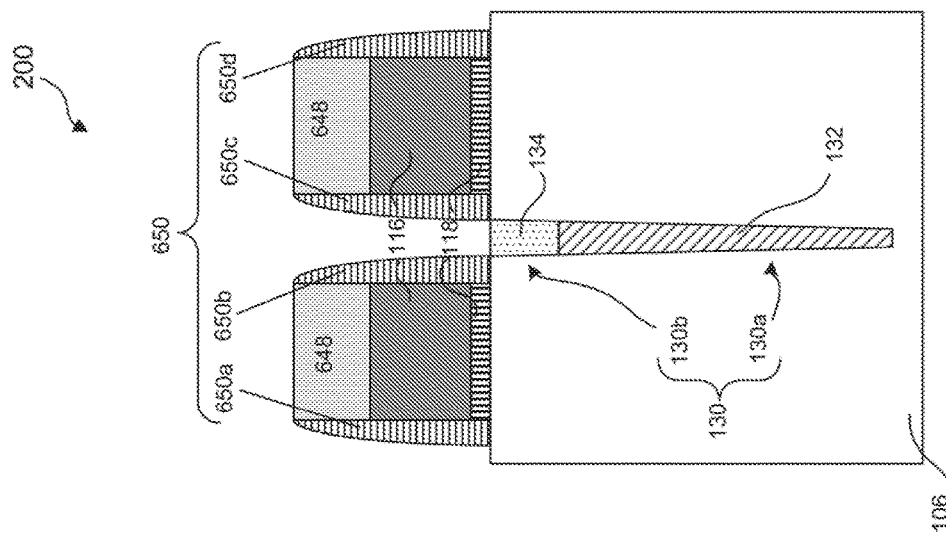
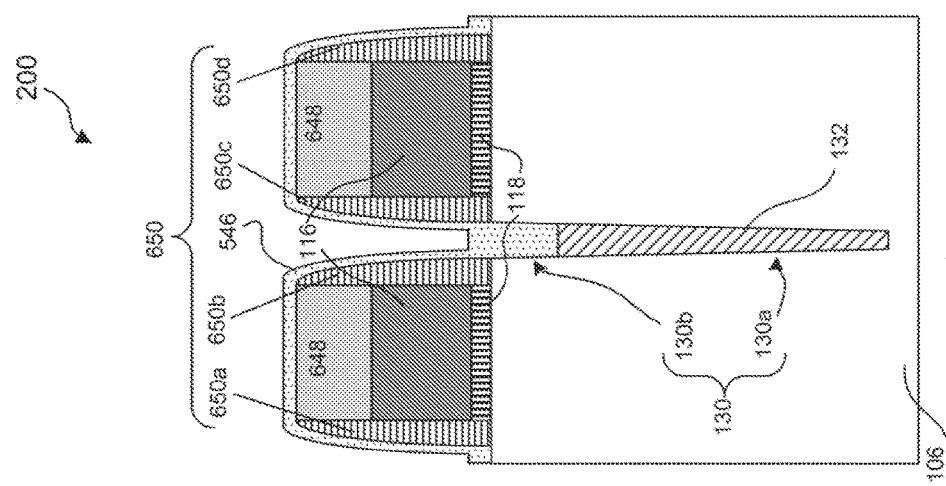

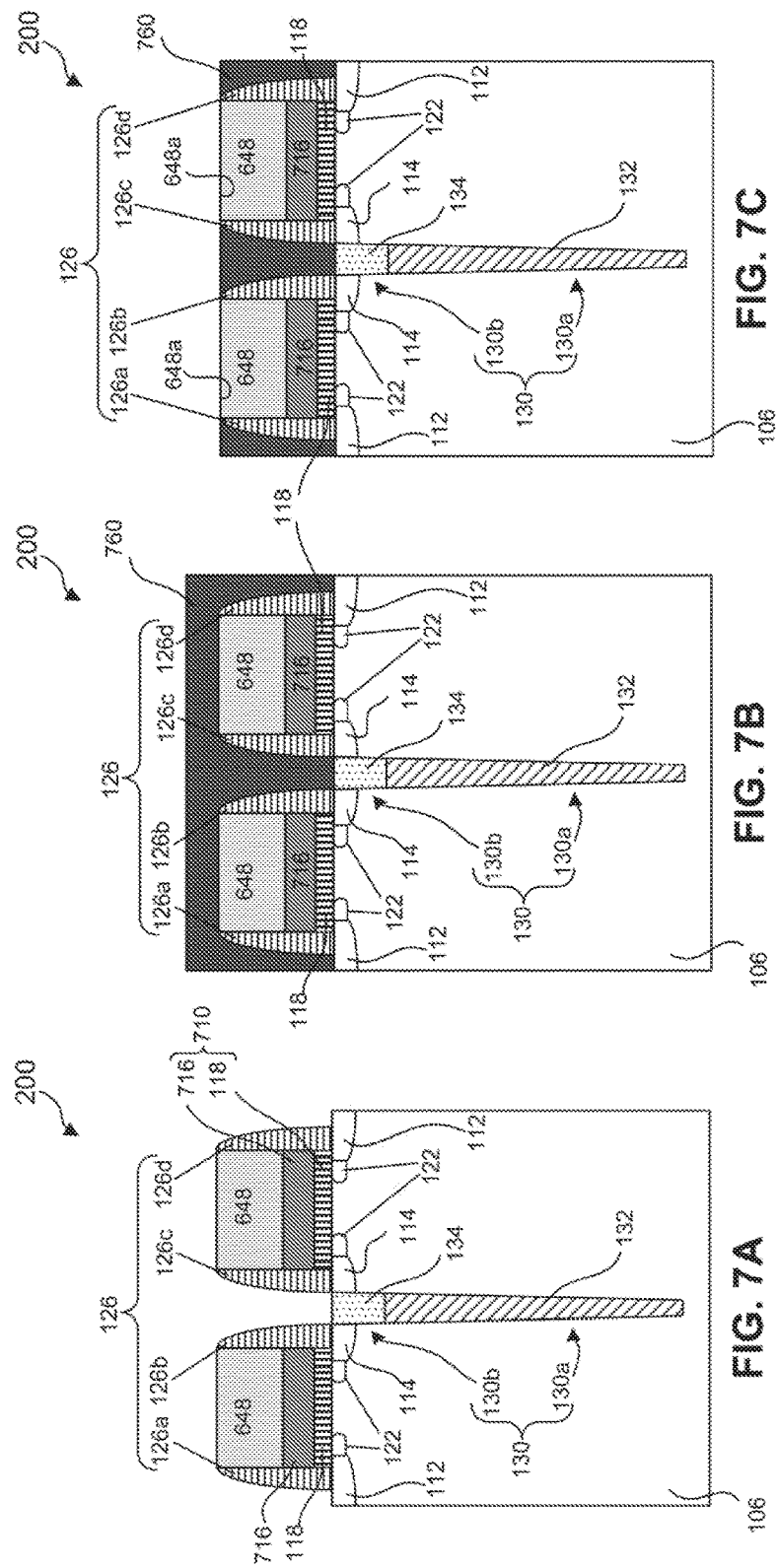

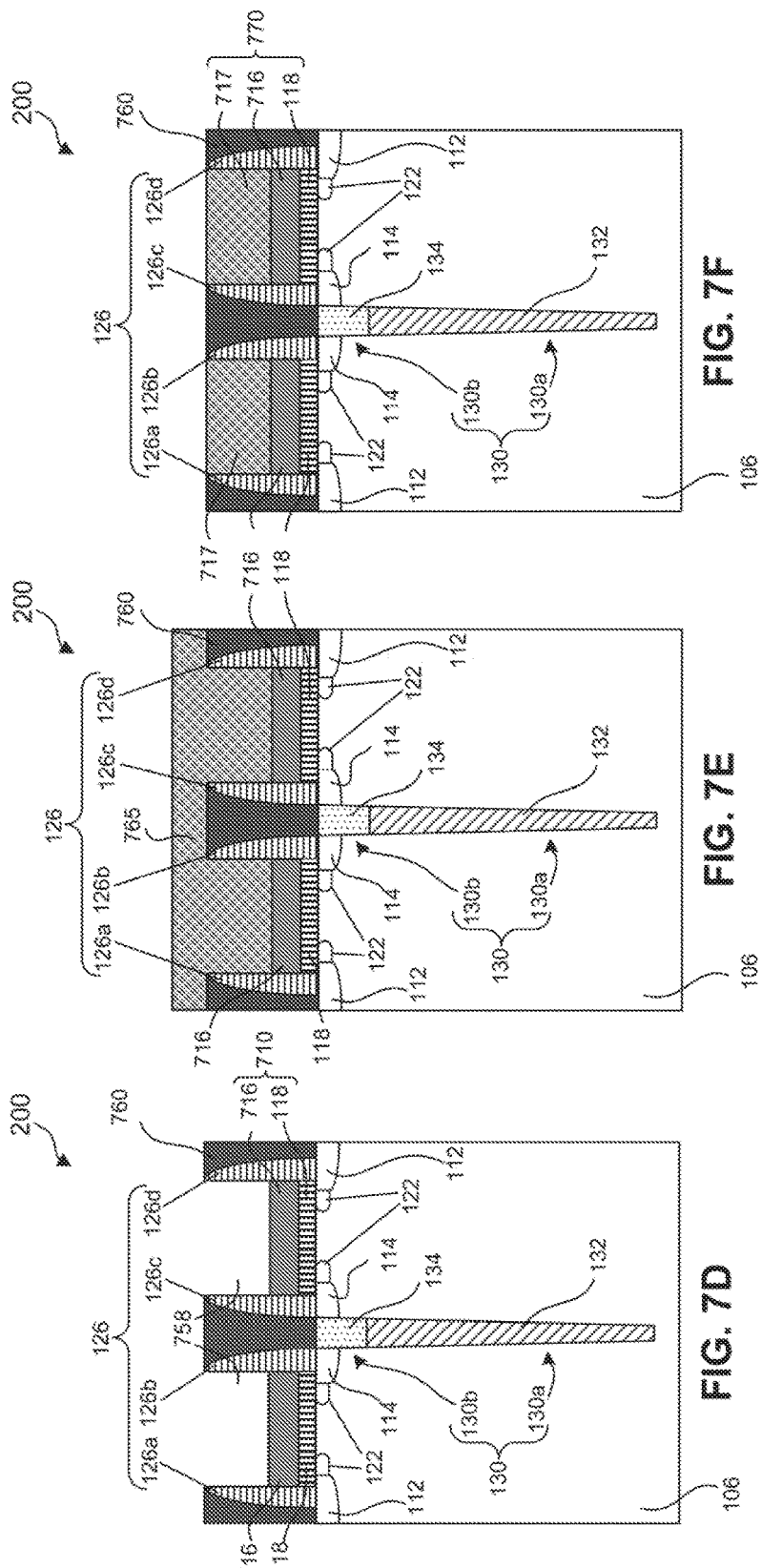

US 10,256,137 B2

SELF-ALIGNED TRENCH ISOLATION IN INTEGRATED CIRCUITS

PRIORITY

This application is a Continuation of U.S. patent application Ser. No. 15/191,882, filed Jun. 24, 2016, which is a Continuation of U.S. patent application Ser. No. 14/048,863, filed Oct. 8, 2013, now U.S. Pat. No. 9,437,470, Issued on Sep. 6, 2016, which is related to U.S. patent application Ser. No. 14/048,527, filed Oct. 8, 2013, now Abandoned, all of which are incorporated by reference herein in their entirety.

TECHNICAL FIELD

The present application relates to the fabrication of trenches buried in substrates of integrated circuits.

BACKGROUND

With the advance in semiconductor technology, there has been increasing demand for higher storage capacity, faster processing systems, and high speed communication systems. To meet these demands, the semiconductor industry continues to scale down dimension of devices, and also increase packing density of devices on an integrated circuit (IC) to accommodate a larger number of devices on an IC. However, this approach of scaling down and closely packing of devices on ICs has drawbacks. The scaling down of devices to smaller dimensions can introduce short channel effects in the devices due to the short channel lengths (about approximately 100 nm or less) of the scaled down devices. In addition, closely spaced devices may suffer from disturbances such as electron leakage, noise coupling, or electrostatic coupling. These drawbacks can degrade the operating characteristics and performance of the devices over time. Thus, it is desirable to improve performance of devices in such high density ICs.

SUMMARY

According to an embodiment, an integrated circuit (IC) includes a substrate, a first device and a second device. Each of the first and second devices include a gate structure. The IC further includes a trench in the substrate self-aligned between the gate structures of the first and second devices. The trench comprises a first filled portion having a dielectric material and a second filled portion having a conductive material. The first filled portion is configured to form a buried trench isolation between the first and second devices.

According to another embodiment, a method for fabricating an integrated circuit (IC) is provided. The method includes defining an area on a substrate between a first and second gate structure, where defining an area comprises patterning the first and second gate structure on a top surface of the substrate. The method further includes forming spacers on the first and second gate structures and forming a self-aligned trench in the defined area. The self-aligned trench comprises a first and second portion with the second portion comprising an open end of the trench. The method further includes filling the first portion with a dielectric material and the second portion with a conductive material.

According to another embodiment, a method for fabricating an IC is provided. The method includes defining an area on a substrate between a first and second partial gate structure, where defining an area comprises patterning the first and second partial gate structure on a top surface of the substrate. The method further includes forming a self-aligned trench in a substrate between the first and second partial gate structure. The self-aligned trench includes a first portion filled with a dielectric material and a second portion filled with a conductive material.

Further features and advantages of the embodiments, as well as the structure and operation of various embodiments of the patent document, are described in detail below with reference to the accompanying drawings. It is noted that the subject matter is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings illustrate the present disclosure and, together with the description, further serve to explain the principles of the disclosure and to enable one skilled in the pertinent art to make and use the disclosure.

FIG. 1 illustrates a cross-sectional view of an IC, according o a first embodiment.

FIG. 2 illustrates a cross-sectional view of an IC, according to a second embodiment.

FIGS. 6A-6L illustrate cross-sectional views of an IC including a self-aligned trench at select stages of its fabrication process, according to an embodiment.

FIGS. 7A-7F illustrate cross-sectional views of an IC including a self-aligned trench at select stages of its fabrication process, according to another embodiment.

Figure 4:
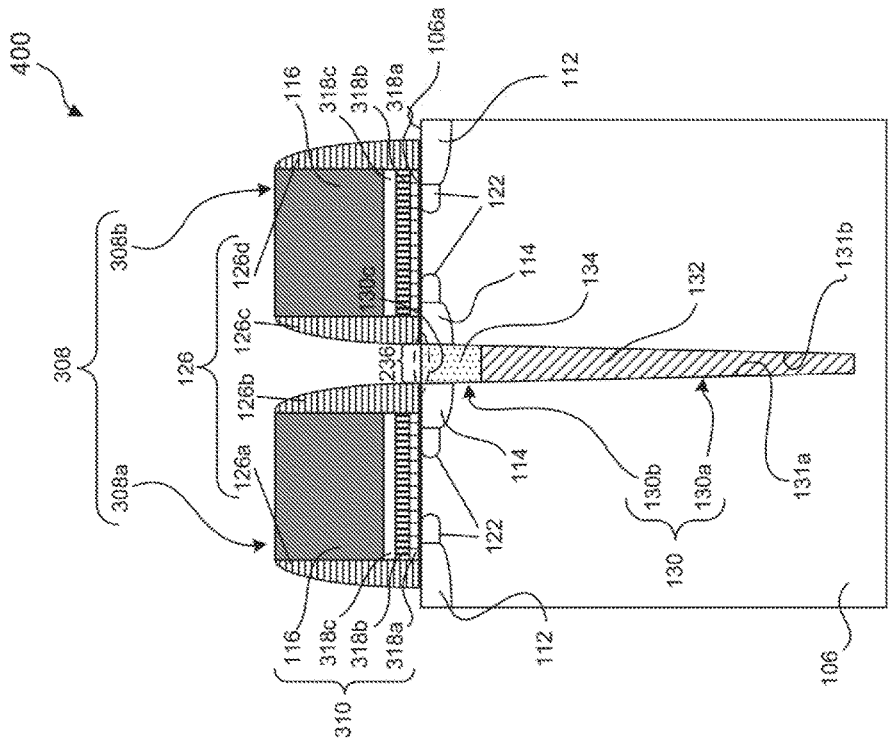
FIG. 4 illustrates a cross-sectional view of an IC, according to a fourth embodiment.

The present disclosure will now be described with reference to the accompanying drawings. In the drawings, like reference numbers generally indicate identical or similar elements. Additionally, generally, the left-most digit(s) of a reference number identifies the drawing in which the reference number first appears.

DETAILED DESCRIPTION

The following Detailed Description refers to accompanying drawings to illustrate embodiments consistent with the disclosure. The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The embodiments described herein are provided for illustrative purposes, and are not limiting. Other embodiments are possible, and modifications may be made to the embodiments within the spirit and scope of the disclosure. Therefore, the Detailed Description is not meant to limit the present disclosure. Rather, the scope of the present disclosure is defined only in accordance with the following claims and their equivalents.

The following Detailed Description of the embodiments will so fully reveal the general nature of the present disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various semiconductor devices, and should not be limited to any particular type of semiconductor devices. Before describing the various embodiments in more detail, further explanation shall be given regarding certain terms that may be used throughout the descriptions.

In embodiments, the term "etch" or "etching" or "etchback" generally describes a fabrication process of patterning a material, such that at least a portion of the material remains after the etch is completed. For example, generally the process of etching a semiconductor material involves the steps of patterning a masking layer (e.g., photoresist or a hard mask) over the semiconductor material, subsequently removing areas of the semiconductor material that are no longer protected by the mask layer, and optionally removing remaining portions of the mask layer. Generally, the removing step is conducted using an "etchant" that has a "selectivity" that is higher to the semiconductor material than to the mask layer. As such, the areas of semiconductor material protected by the mask would remain after the etch process is complete. However, the above is provided for purposes of illustration, and is not limiting. In another example, etching may also refer to a process that does not use a mask, but still leaves behind at least a portion of the material after the etch process is complete.

The above description serves to distinguish the term "etching" from "removing." In an embodiment, when etching a material, at least a portion of the material remains behind after the process is completed. In contrast, when removing a material, substantially all of the material is removed in the process. However, in other embodiments, 'removing' may incorporate etching.

In an embodiment, the term "selectivity" between two materials is described as the ratio between the etch rates of the two materials under the same etching conditions. For example, an etchant with a selectivity of 3:1 to the semiconductor material over the mask layer means that the etchant removes the semiconductor material at a rate three times faster than that at which it removes the mask layer.

In an embodiment, the terms "deposit" or "dispose" describe the act of applying a layer of material to the substrate. Such terms are meant to describe any possible layer-forming technique including, but not limited to, thermal growth, sputtering, evaporation, chemical vapor deposition, epitaxial growth, atomic layer deposition, electroplating, etc.

In an embodiment, the term "substrate" describes a material onto which subsequent material layers are added. In embodiments, the substrate itself may be patterned and materials added on top of it may also be patterned, or may remain without patterning. Furthermore, "substrate" may be any of a wide array of semiconductor materials such as silicon, germanium, gallium arsenide, indium phosphide, etc. In other embodiments, the substrate may be electrically non-conductive such as a glass or sapphire wafer.

In an embodiment, the term "substantially perpendicular," in reference to a topographical feature's sidewall, generally describes a sidewall disposed at an angle ranging between about 85 degrees and 90 degrees with respect to the substrate.

In an embodiment, the term "substantially in contact" means the elements or structures n substantial contact can be in physical contact with each other with only a slight separation from each other.

In an embodiment, devices fabricated in and/or on the substrate may be in several regions of the substrate, and these regions may not be mutually exclusive. That is, in some embodiments, portions of one or more regions may overlap.

An Integrated Circuit According to a First Embodiment

FIG. 1 illustrates a cross-sectional view of an IC 100 according to an embodiment. IC 100 may include a substrate 106, devices 108, and a trench 130 in an example. Devices 108 as shown in FIG. 1 include only two devices 108a and 108b for the sake of simplicity. However, as would be understood by a person of skilled in the art based on the description herein, devices 108 may include any number of devices.

Substrate 106 may be a silicon (Si) substrate implanted with p-type carriers to be a p-type Si substrate, according to an example embodiment. The p-type carriers may be provided by p-type materials, such as, but not limited to, boron. Alternatively, substrate 106 may be a p-type well formed in an n-type Si substrate or well (not shown). N-type Si substrate are formed implanted with n-type carriers that are provided by n-type materials, such as, but not limited to, phosphorus.

In an example, devices 108a and 108b may each represent a field-effect transistor (FET) including doped regions 112 and 114 and a gate structure 110. Devices 108a and 108b may be similar in structure and function. Alternatively, devices 108a and 108b may be two distinct devices. Doped region 112 may be used as a source/drain region, and similarly, doped region 114 may also be used as a source/drain region. It is understood by a skilled artisan that the source and drain regions of devices 108a and 108b may be interchangeable and are named based on voltage values applied to doped regions 112 and 114. While doped regions 112 and 114 are n-type in this example, they may also be p-type regions when substrate 106 is n-type Si or an n-type well formed in a p-type Si substrate. Further, doped regions 112 and 114 may be formed, for example, using ion implantation to dope substrate 106 with n-type carriers using n-type materials, such as, but not limited to, arsenic. The n-type carrier concentration in doped regions 112 and 114 may be higher than the p-type carrier concentrations of substrate 106 to form heavily doped regions. Generally, doping a material with a comparatively large doping concentration of carriers equal or greater than $10^{19}/cm^3$, refers to a doping that is high or heavy.

According to an embodiment, gate structure 110 may be positioned on a top surface 106 a of substrate 106 between doped regions 112 and 114 and in substantial contact with at least a portion of doped region 112 and doped region 114. Gate structure 110 may include a gate layer 116 and a gate dielectric layer 118. Gate layer 116 may be disposed over gate dielectric layer 118 and gate dielectric layer 118 may be disposed over substrate 106. The material used to form gate layer 116 may be, for example, doped polysilicon, metal, or any combination thereof and the material for forming gate dielectric layer 118 may be, for example, thermal oxide, nitride layer, high-k dielectric, or any combination thereof. Gate structure 110 comprises a vertical dimension 111 that is a sum of a vertical dimension 111a of gate layer 116 and a vertical dimension 111b of gate dielectric layer 118.

In an example of this embodiment, applying a first potential to gate structure 110 and a second potential that is lower than the first potential to doped region 112 may cause the n-type carriers below the gate structure 110 to form a channel region (not shown) between doped regions 112 and 114. When a third potential that is higher than the second potential is applied to doped region 114, the n-type carriers accumulated in the channel region may allow a current to flow from doped region 114 to doped region 112. This current is typically referred to as the drain current.

Devices 108 may comprise a depletion region that is depleted of free carriers in a channel region in an example embodiment (not shown). If a positive voltage is applied to doped region 114, the depletion region can spread in channel region from doped region 114 to doped region 112. If the depletion region reaches doped region 112, then "punch-through" may occur. In such instance, gate structure 110 may no longer be able to control the drain current from doped region 114 to doped region 112.

In an embodiment, pocket implants 122 may be formed to prevent punchthrough in devices 108. For example, pocket implants 122 may hinder the depletion region from reaching doped region 112 when the depletion region extends through channel region. Pocket implants 122 may be doped with, for example, boron atom s.

Devices 108 may further include spacers 126 above doped regions 112 and 114 and in substantial contact with respective first and second sides 110a and 110b of the gate structure 110 in accordance to an example embodiment. Spacers 126 may be formed using a dielectric material, such as silicon nitride or silicon oxide, though any suitable insulating material may be used.

In accordance with an embodiment, trench 130 may be positioned in substrate 106 between devices 108a and 108b. While trench 130 is shown in FIG. 1 to comprise a vertical cross-section having a trapezoidal perimeter, in alternate embodiments trench 130 may comprise vertical cross-sections having any geometric shaped perimeters (e.g. rectangular). Trench 130 may comprise a first portion 130a, a second portion 130b, an open end 130c, and a closed end 130d. In an example, first portion 130a may comprise a vertical dimension of about 100 nm-400 nm and second portion 130b may comprise a vertical dimension of about 100 nm or less. First portion 130a may be filled with a dielectric material to form a first filled portion 132 of trench 130 and second portion 130b may be filled with a conductive material to form a second filled portion 134 of trench 130. The dielectric material filling first portion 130a may be, for example, oxide or nitride and the conductive material filling second portion 130b may be, for example, single-crystalline silicon, amorphous silicon ("a-Si") or polycrystalline silicon ("polySi"), silicon germanium (SiGe), metal silicides, or metal. Thus, first filled portion 132 may form a buried trench isolation within substrate 106 between devices 108a and 108b.

In an embodiment, first and second filled portions 132 and 134 may be formed such that top surface 132a of first filled portion 132 is in substantial contact with bottom surface 134b of second filled portion 134, and bottom surface 132b of first filled portion 132 is in substantial contact with substrate 106. While top surface 134a of second filled portion 134 is illustrated in FIG. 1 to be coplanar with top surface 106 a of substrate 106, it should be understood that top surface 134a may be raised or lowered with respect to top surface 106a depending on application of IC 100 by the user In an embodiment, first filled portion 132 or a part thereof may be in substantial contact with doped region 114 of device 108a and doped region 112 of device 108b. In another example, second filled portion 134 or a part thereof may be in substantial contact with doped region 114 of device 108a and doped region 112 of device 108b and provide a conductive path between doped region 114 of device 108a and doped region 112 of device 108a.

As noted above, electronic processes may be carried out within a region of substrate 106 during operation of devices 108. These electronic processes of device 108a may create disturbances such as, but not limited to, current leakage, noise coupling, or electrostatic coupling that may negatively affect the electronic processes and as a result the performance of adjacent device 108b in instances where devices 108 are closely spaced on substrate 106. In such instances, first filled portion 132 may provide electrical isolation between the electronic processes of devices 108a and 108b within substrate 106, according to an embodiment.

It should be noted that IC 100 is shown in FIG. 1 as including only one arrangement of trench 130 interposed between adjacent devices 108a and 108b for the sake of simplicity. However, as would be understood by a person of skilled in the art based on the description herein, IC 100 may include any number of such arrangements with devices and trenches similar to devices 108 and trench 130, respectively. In addition, IC 100 may include other devices and functional units that are not shown for the sake of simplicity.

An Integrated Circuit According to a Second Embodiment

FIG. 2 illustrates a cross-sectional view of an IC 200 according to an embodiment. IC 200 is similar to IC 100 as described above. Therefore, only differences between IC 100 and 200 are described herein.

IC 200 comprises a trench 130 that may be self-aligned between adjacent devices 108a and 108b according to an embodiment. In an embodiment, the self-aligned placement of trench 130 may be defined by a spacing 236 formed between spacers 126b and 126c on top surface 106a of substrate 106. In such instance, a lateral dimension of open end 130c of trench 130 may be equal to spacing 236. Alternatively, the self-aligned placement of trench 130 may be defined by a spacing formed between gate structures 110 of devices 108 on top surface 106a (not shown). In an embodiment, the term "self-aligned" refers to formation of trench 130 that may be aligned between two features (e.g. spacers 126b and 126c, devices 108a and 108b) of IC 200 without performing any additional steps for the alignment of trench 130. According to an embodiment, the self-aligned placement of trench 130 may allow devices 108 in IC 200 to be more closely spaced on substrate 106 than those in IC 100.

A Integrated Circuit According to a Third Embodiment

Figure 3:
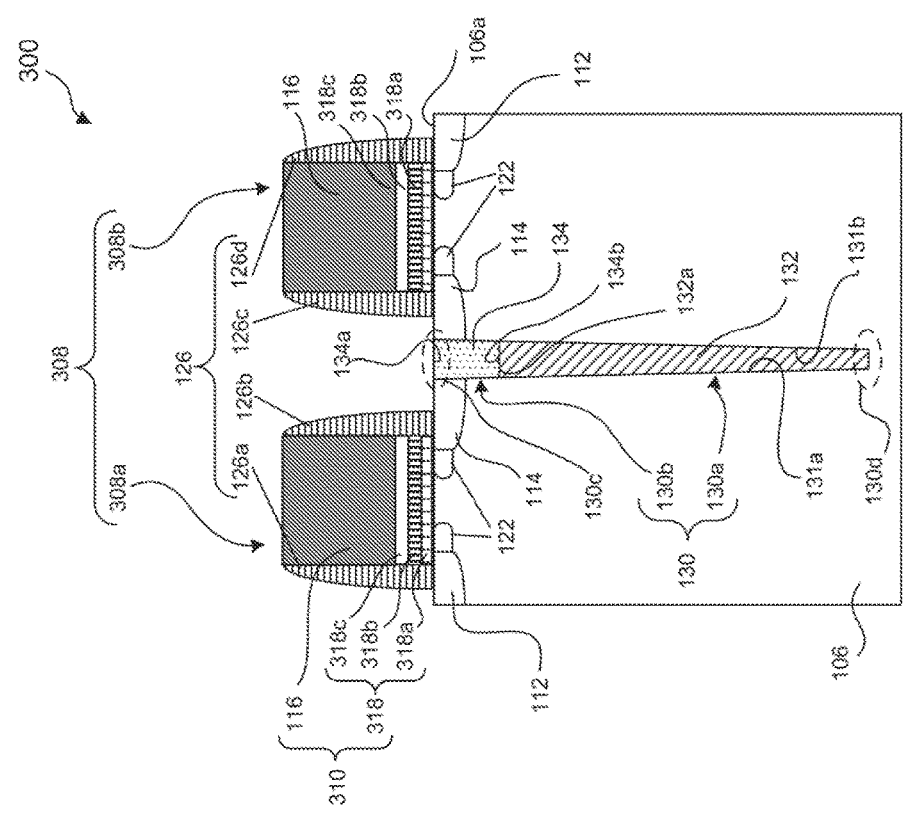
FIG. 3 illustrates a cross-sectional view of an IC, according to a third embodiment.

FIG. 3 illustrates a cross-sectional view of an IC 300 according to an embodiment. IC 300 may include a substrate 106, devices 308, and a trench 130. As IC 300 is similar to IC 100 as described above, only differences between IC 100 and 300 are described herein.

In an embodiment, devices 308a and 308b may each comprise a gate structure 310 disposed on top surface 106a of substrate 106 between doped regions 112 and 114 and in substantial contact with at least a portion of doped region 112 and doped region 114. Gate structure 310 may include a gate layer 116 and a stack of layers 318. Stack of layers 318 may comprise a charge storing layer 318b interposed between a first dielectric layer 318a and a second dielectric layer 318c. First dielectric layer 318a may be disposed over and in substantial contact with top surface 106a of substrate 106. Charge storing layer 318b may be disposed over and in substantial contact with first dielectric layer 318b, Second dielectric layer 318c may be disposed over and in substantial contact with charge storing layer 318b. First and second dielectric layers 318a and 318c may each comprise an oxide layer such as, but not limited to silicon dioxide. Alternatively, second dielectric layer 318e may include a stack of dielectric layers (not shown) comprising, for example, a nitride layer interposed between oxide layers.

Charge storing layer 318b may include, for example, a charge-trapping nitride layer such as, but not limited to, silicon nitride layer, silicon-rich nitride layer, or any layer that includes, but is not limited to, silicon, oxygen, and nitrogen, in various stoichiometries. Generally, a three layer stack arrangement of such dielectric layers is referred to as an "oxide, nitride, oxide (ONO) stack," or simply as "ONO layers."

Alternatively, charge storing layer 318b may include a polySi layer. Such a polySi charge storing layer 318b may be used as a floating gate with gate layer 116 used as a control gate in devices 308, according to an embodiment. Generally, such devices are referred as floating gate devices. It should be understood that the relative thickness of gate layer 116, charge storing layer 318b and first and second dielectric layers 318a and 318b presented herein are for illustrative purposes only and not necessarily drawn to scale in FIG. 3.

According to various embodiments, IC 300 may represent an analog or digital memory device and devices 308 may represent memory cells. In this embodiment, each device of devices 308 may be programmed as follows. Charge storing layer 318b may be programmed to the charged program level by applying a potential to doped region 114 (functioning as the drain) and a potential to gate structure 310, while doped region 112 may function as the source source of electrons). A potential may also be applied to doped region 112. The potential applied to gate structure 310 and doped regions 112 and 114 may generate a vertical electric field through charge storing layer 318b and first and second dielectric layers 318a and 318c, At the same time, a lateral electric field along the length of channel from doped region 112 to doped region 114 may be generated. At a given threshold voltage, channel may invert such that electrons are drawn off doped region 112 and caused to accelerate toward doped region 114. As the electrons move along the length of channel, the electrons gain energy and upon attaining enough energy, the electrons are able to jump over the potential barrier of first dielectric layer 318a and into charge storing layer 318b where the electrons may be stored in this layer.

As noted above, electronic processes are carried out within substrate 106 during programming of devices 308. The electronic processes of one device may cause disturbances that affects the performance of adjacent devices in instances where devices are closely spaced on substrate 106. For example, during programming of device 308a, electrons within substrate 106 may migrate from device 308a to closely spaced adjacent device 308b and affect the operational performance of device 308b. In such instances, first filled portion 132 may provide electrical isolation within substrate 106 between devices 308a and 308b, according to an embodiment.

A Integrated Circuit According to a Fourth Embodiment

FIG. 4 illustrates a cross-sectional view of an IC 400 according to an embodiment. IC 400 is similar to IC 300 as described above. Therefore, only differences between IC 300 and 400 are described herein.

Trench 130 may be self-aligned between adjacent devices 308a and 308b according to an embodiment. The self-aligned placement of trench 130 may be defined by a spacing 236 formed between spacers 126b and 126 con top surface 106a of substrate 106 in an example. In such instance, a lateral dimension of open end 130c of trench 130 may be equal to a spacing 236. Alternatively, the self-aligned placement of trench 130 may be defined by a spacing formed between gate structures 310 of devices 308 on top surface 106a (not shown).

An Example Method for Fabricating an Integrated Circuit According to a First Embodiment FIGS. 5A-5H illustrate an example fabrication process for forming IC 100 shown in FIG. 1, according to an embodiment.

Figure 5B:
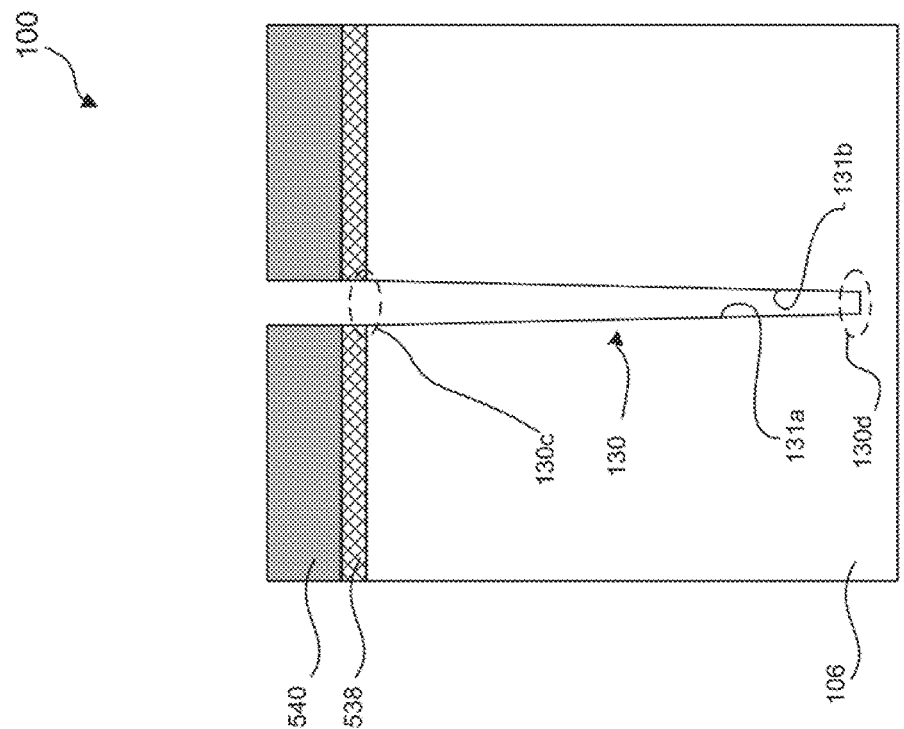
FIGS. 5A-5H illustrate cross-sectional views of an IC including a buried trench at select stages of its fabrication process, according to an embodiment.
Figure 5A:
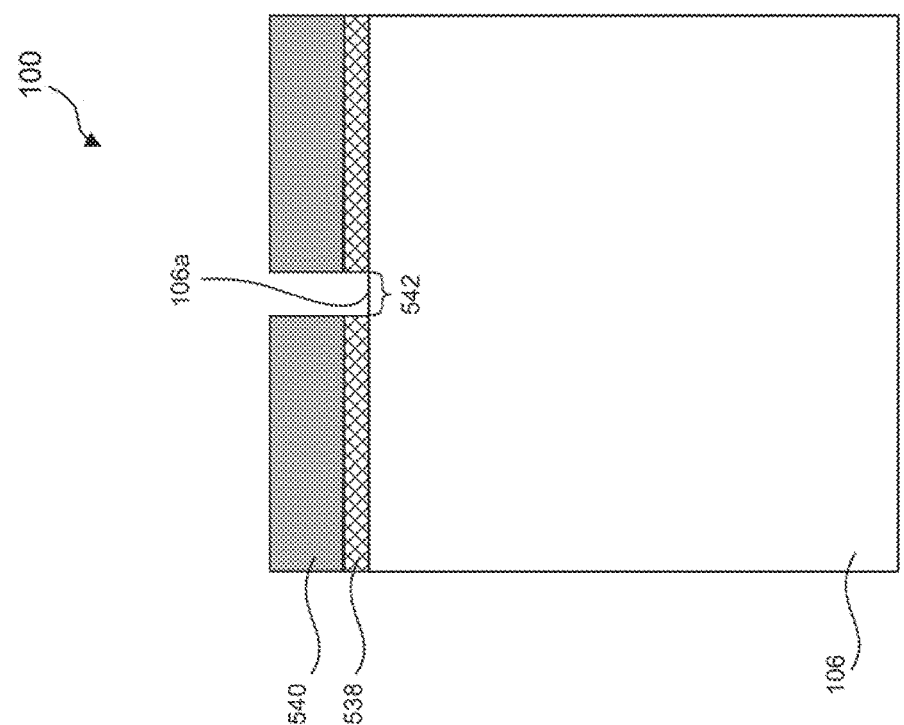

FIG. 5A illustrates a cross-sectional view of a partially fabricated IC 100 after formation of a trench etch area 542 on top surface 106a of substrate 106, according to an embodiment. Trench etch area 542 may be formed by patterning of a first hard mask layer 538 and a second hard mask layer 540 on substrate 106, as shown in FIG. 5A. Patterning of first and second hard mask layers 538 and 540 may be performed by standard photolithography and etching processes. First hard mask layer 538 may be disposed on top surface 106a of substrate 106, for example, by growing a thermal oxide such as silicon oxide directly from substrate 106 using thermal oxidation. Second hard mask layer 540 may be disposed on first hard mask layer 538, for example, by depositing a layer of nitride such as silicon nitride using conventional deposition methods such as, but not limited to, chemical vapor deposition (CVD) or atomic layer deposition (ALD). The relative thickness of first and second hard mask layers 538 and 540 formed with respect to each other may be equal or different, according to various embodiments.

FIG. 5B illustrates a cross-sectional view of a partially fabricated IC 100 after formation of trench 130 in trench etch area 542 as described previously with reference to FIG. 5A, according to an embodiment. The patterned first and second hard mask layers 538 and 540 may assist in guiding the formation of trench 130 in trench etch area 542. Trench 130 may be formed by any conventional etching methods suitable for etching the material of substrate 106. For example, a dry etch process such as, but not limited to, reactive ion etching (RIE) may be performed to remove the material of substrate 106 for the formation of trench 130, according to an embodiment. The etching process may be performed to selectively etch the material of substrate 106 in trench etch area 542 without significant etching or removal of first and second hard mask layers 538 and 540. This selective etching may be done by employing an etchant that has higher selectivity to the material of substrate 106 than the materials of first and second hard mask layers 538 and 540.

Figure 5D:
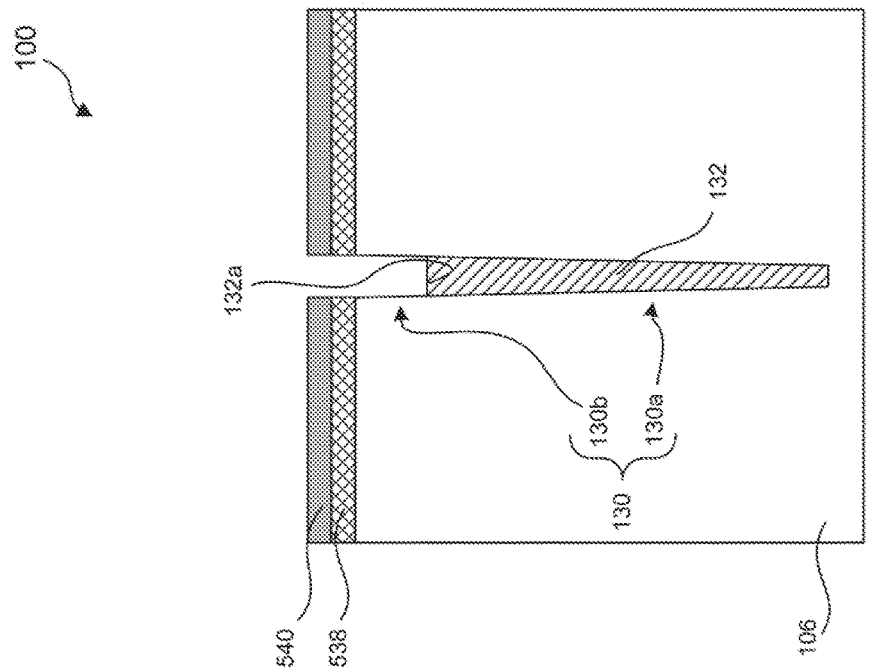
Figure 5C:
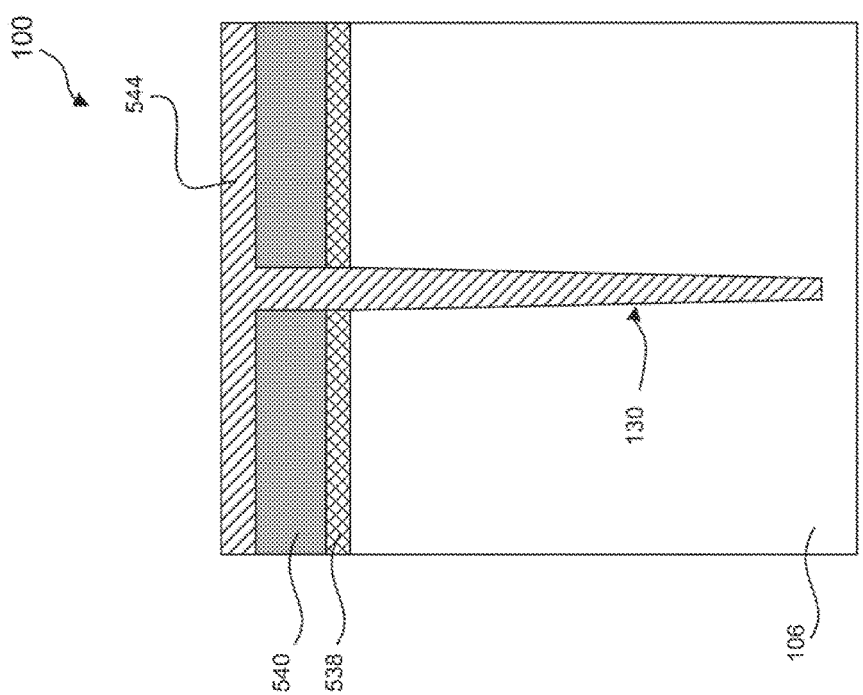

FIGS. 5C-5D illustrate cross-sectional views of partially fabricated IC 100 during formation of first filled portion 132 of trench 130, according to an embodiment. The formation of first filled portion 132 may comprise a filling process followed by an etch back process. The filling process may be performed by depositing a layer 544 of dielectric material over the partially fabricated IC 100 of FIG. 5B such that at least both first and second portions 130a and 130b of trench may be filled, as shown in FIG. 5C. The deposition of layer 544 may be performed using any conventional deposition methods suitable for dielectric materials. For example, dielectric materials such as silicon oxide or silicon nitride may be deposited for layer 544 using a CVD or an ALD process. Following the deposition of layer 544, an etch-back process may be performed to remove layer 544 from all areas except for first portion 130a, as shown in FIG. 5D. The formation of first filled portion 132 may be followed by removal of second hard mask layer 540 by using any conventional etching method.

Figure 5F:
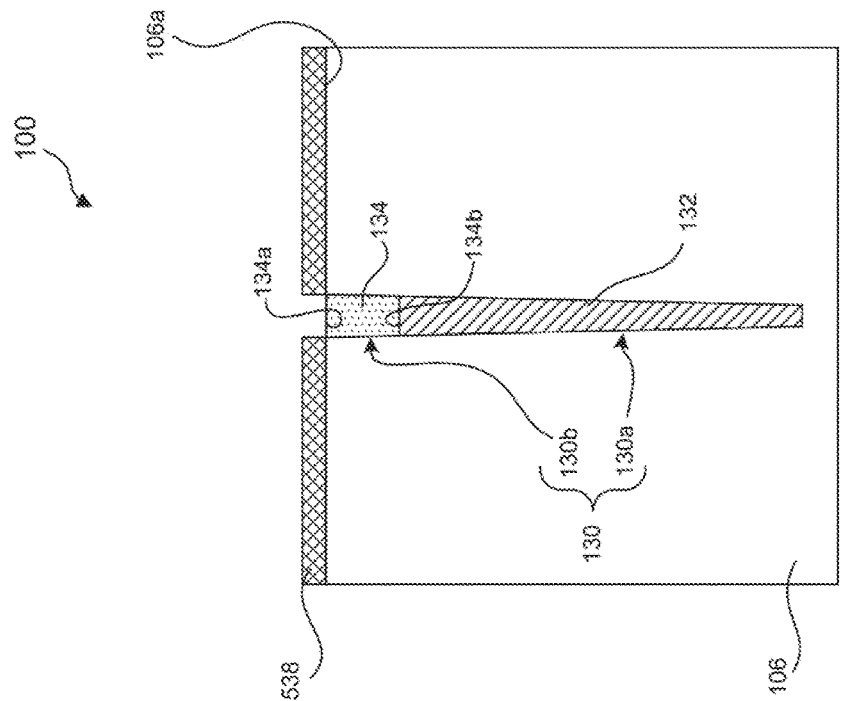
Figure 5E:
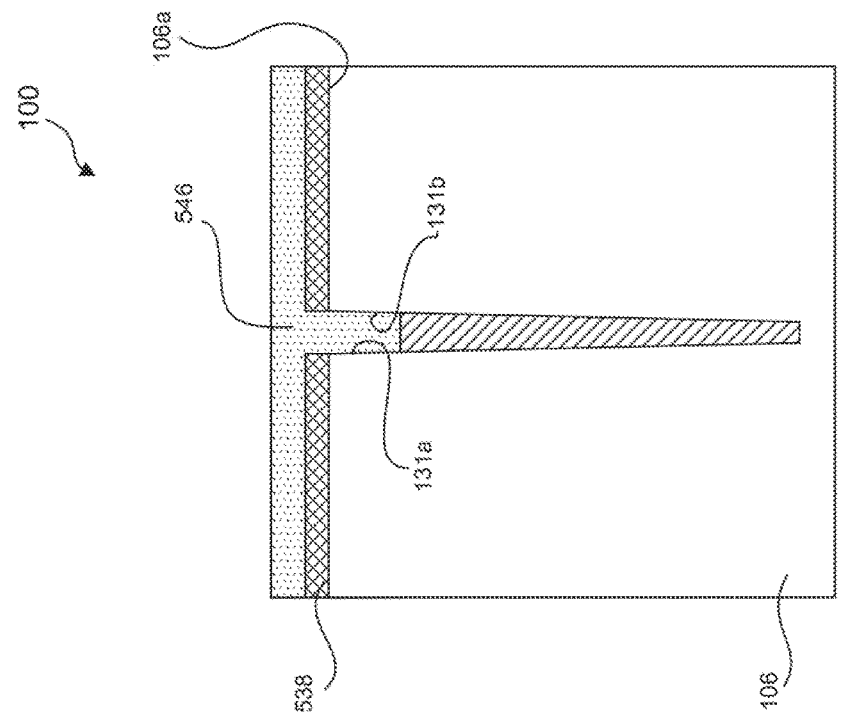

FIGS. 5E-5F illustrate a cross-sectional view of a partially fabricated IC 100 during formation of second filled portion 134 of trench 130, according to an embodiment. The formation of second filled portion 134 may comprise a filling process followed by an etch-back process. According to an embodiment, the filling process may be performed by depositing a layer 546 of conductive material over the partially fabricated IC 100 of FIG. 5D such that at least second portion 130b of trench 130 may be filled, as shown in FIG. 5E. The deposition of layer 546 may be performed using any conventional methods suitable for metals or metal suicides such as, but not limited to, sputtering, thermal evaporation or CVD. Alternatively, a-Si or polySi may be deposited for layer 546 using conventional deposition methods. Following the deposition of layer 546, an etch-back process may be performed to remove layer 546 from all areas except for second portion 130b. The etch-back process may be performed until top surface 134a of second filled portion 134 may be coplanar (FIG. 5F) or raised higher or lower (not shown) with respect to top surface 106a of substrate 106. The formation of second filled portion 134 may be followed by removal of first hard mask layer 538 by using any conventional etching method.

According to another embodiment, the filling process may be performed by growing an epitaxial layer (not shown) from sidewalls 131a and 131b of trench 130 in second portion 130b after the formation of first filled portion 132. This growth may be performed selectively in second portion 130b as all other areas on substrate 106 are protected by first hard mask layer 538 or first filled portion 132. Due to such selective growth to forty second filled portion 134, the etch-back process may be eliminated. The epitaxial layer in second portion 130b may be doped in-situ or by ion implantation to improve electrical conductivity of second filled portion 134.

Figure 5H:
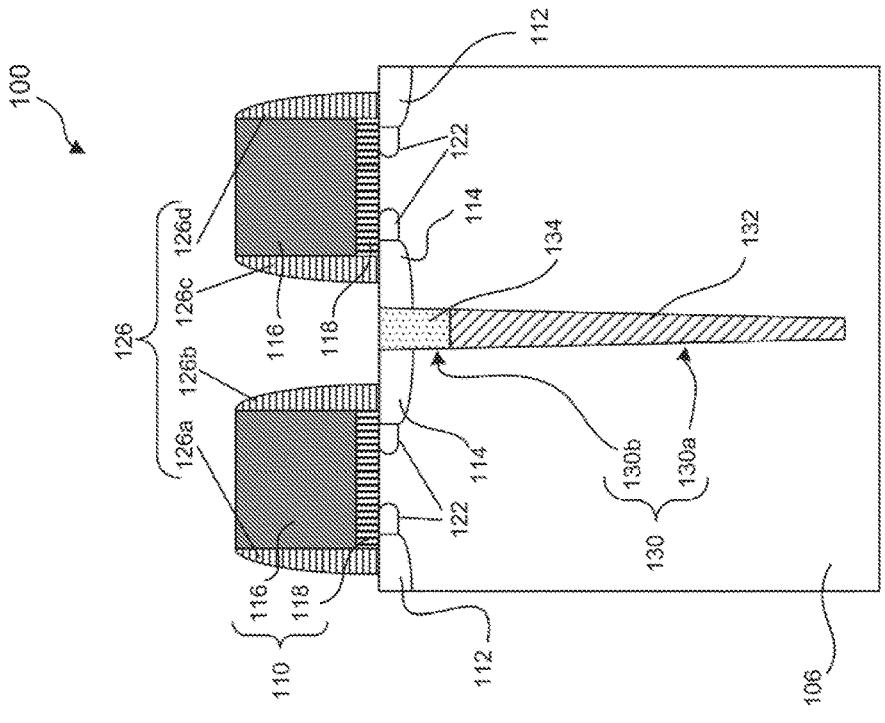
Figure 5G:
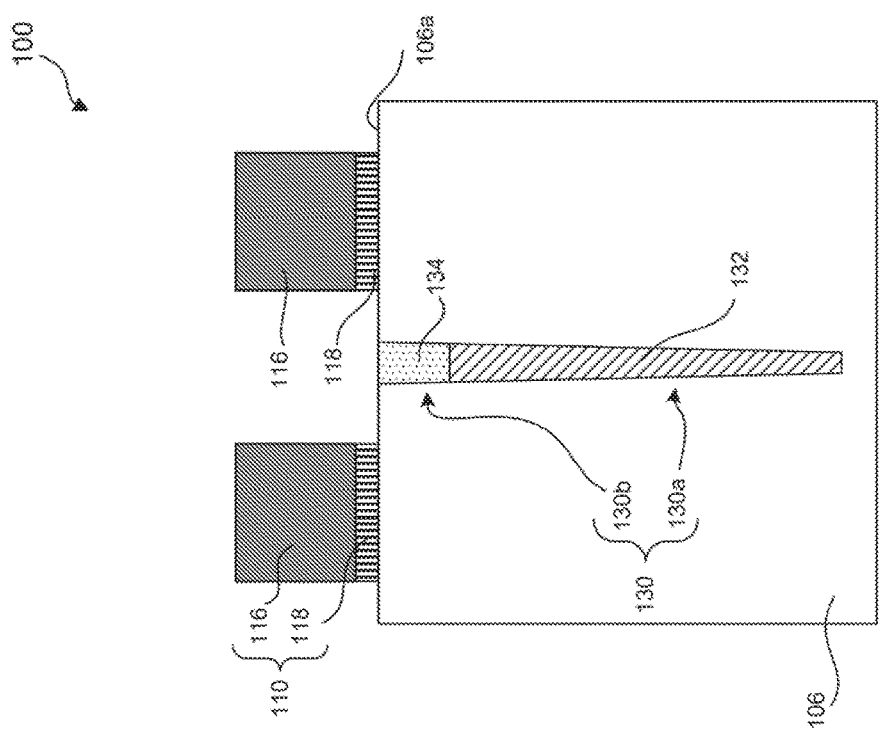

FIG. 5G illustrates a cross-sectional view of a partially fabricated IC 100 after formation of gate structures 110, according to an embodiment. It should be understood that formation of only two gate structures illustrated herein are for the sake of simplicity and not intended to be limiting. The formation of gate structures 110 may comprise a formation of gate dielectric layer 118 on the entire top surface 106a of substrate 106 followed by a formation of gate layer 116 on the entire surface of gate dielectric layer 118. Gate dielectric layer 118 may be formed by growing, for example, silicon oxide directly from substrate 106 using thermal oxidation, assuming substrate 106 to be Si in this embodiment. Alternatively, gate dielectric layer 118 may be formed by depositing silicon oxide, high-k dielectric, other dielectric material, or any combination thereof using a chemical vapor deposition process. Gate layer 116 may be formed by depositing a metal layer, a polySi layer, or any combination thereof using deposition methods such as the ones mentioned above for deposition of metal and polySi. This formation of gate dielectric layer 118 and gate layer 116 may be followed by a patterning and an etching process to define gate structures 110, as shown in FIG. 5G. The patterning process may be performed by standard photolithography process and the etching process may be performed by dry etch methods such as the ones mentioned above.

FIG. 5H illustrates a cross-sectional view of a fabricated IC 100 (as shown in FIG. 1) after formation of doped regions 112 and 114, pocket implants 122, and spacers 126, according to an embodiment. Doped regions 112 and 114 may be formed by an ion implantation method. The ion implantation method may be carried out, for example, using n-type dopants such as arsenic or phosphorous. Prior to or subsequent to doped region formation, pocket implants 122 may be formed. Pocket implants 122 may be implanted using an ion implantation process at an angle into substrate 106 to form the pocket implants at a deeper region below gate structures 110 than doped regions 112 and 114, as shown in FIG. 5H. Following the formation of pocket implants 122, and doped regions 112 and 114, spacers 126 may be formed. Spacers 126 may be a dielectric material such as silicon oxide or silicon nitride. The formation of spacers 126 (as shown in FIG. 5H) may involve first depositing a dielectric material over the partially formed IC 100 of FIG. 5G or after the formation of doped regions 112 and 114 such that it covers at least the gate structures 110. The deposition may be carried out by, for example, using a CVD process. This deposition process may be followed by defining spacers 126 as shown in FIG. 5H by patterning the deposited dielectric material for spacers using standard photolithography and etching processes.

It should be understood that the various layers illustrated during the example fabrication process of IC 100 are not necessarily drawn to scale. In addition, the above description is meant to provide a general overview of select steps involved in forming IC 100 shown in FIG. 1 and that, in actual practice, more features and/or fabrication steps may be performed additionally or alternatively to that described herein to form IC 100, as would be understood by one skilled in the art given the description herein.

An Example Method for Fabricating an Integrated Circuit According to a Second Embodiment FIGS. 6A-6L illustrate an example fabrication process for forming IC 200 including self-aligned trench shown in FIG. 2, according to an embodiment.

FIG. 6A illustrates a cross-sectional view of a partially fabricated IC 200 after formation of gate structures 110 and hard mask layers 648, according to an embodiment. The formation of gate structures 110 and hard mask layers 648 may comprise a formation of gate dielectric layer 118 on the entire top surface 106a of substrate 106, followed by a formation of gate layer 116 on the entire surface of gate dielectric layer 118, and a subsequent deposition of hard mask layer 648 on the entire surface of gate layer 116. Gate dielectric layer 118 may be formed by growing, for example, silicon oxide directly from substrate 106 using thermal oxidation, assuming substrate 106 to be Si in this embodiment. Alternatively, gate dielectric layer 118 may be formed by depositing silicon oxide, high-k dielectric, other dielectric material, or any combination thereof using a chemical vapor deposition process. Gate layer 116 may be formed by depositing a metal layer, a polySi layer, or any combination thereof using deposition methods such as the ones mentioned above for deposition of metal and polySi. The deposition of hard mask layer 648 may involve depositing a dielectric material such as, but not limited to, silicon oxide or silicon nitride, for example, using a CVD process. This formation of gate dielectric layer 118, gate layer 116, hard mask layer 648 may be followed by a patterning and an etching process to define gate structures 110 and hard mask layers 648, as shown in FIG. 6A. The patterning process may be performed by standard photolithography process and the etching process may be performed by dry etch methods such as the ones mentioned above.

Using a similar method of depositing and patterning, spacers 650 may be formed along sidewalk 110a and 110b of gate structures 110 as shown in FIG. 6B. The material for spacers 650 may be dielectric materials such as, but not limited to, silicon oxide or silicon nitride. Hard mask layers 648 and spacers 650 may act as masking layers for gate structures 110 to prevent damage to gate structures 110 during subsequent fabrication processes.

According to an embodiment, gate structures 110 along with spacers 650 may act as a patterned masking layer on substrate 106 to define a trench etch area 642 between spacers adjacent spacers 650b and 650c, as shown in FIG. 6B. This trench etch area 642 may be used for a self-aligned formation of trench 130, as shown in FIG. 6C, according to an embodiment. In an embodiment, the term "self-aligned" refers to formation of trench 130 that may be aligned between two features (e.g. spacers 650b and 650c) of IC 200 without performing any additional steps for the alignment of trench 130.

The material of substrate 106 from trench etch area 642 may be removed by any conventional etching methods suitable for etching the material of substrate 106. For example, a dry etch process such as, but not limited to, reactive ion etching (RIE) may be performed to remove the material of substrate 106 for the self-aligned formation of trench 130, according to an embodiment. The etching process may be performed to selectively etch the material of substrate 106 in trench etch area 642 without etching or removal of hard mask layer 648 and spacers 650. This selective etching may be clone by employing an etchant that has higher selectivity to the material of substrate 106 than the materials of hard mask layer 648 and spacers 650.

FIGS. 6D-6F illustrate cross-sectional views of a partially fabricated IC 200 during formation of first filled portion 132 of trench 130, according to an embodiment. This formation may involve an etching process, a subsequent filling process followed by an etch-back process. The etching process involves partial etching of spacers 650. This partial etching may create a wider spacing between spacers 650b and 650c relative to a spacing between sidewalls 131a and 131b of trench 130 for better control of the subsequent filling process, as shown in FIG. 6D. The filling process may involve deposition of a layer 654 of dielectric material over the partially fabricated IC 200 of FIG. 6D such that layer 654 at least fills both portions 130a and 130b of trench 130, as shown in FIG. 6E. The dielectric material of layer 654 may be, for example, silicon oxide or silicon nitride. This deposition may be carried out by any conventional deposition process suitable for dielectric materials such as CVD or ALD. It will be appreciated that the preceding step of widening the spacing between spacers 650b and 650c may help to reduce the high aspect ratio of the filling area 633 between spacers 650b and 650c and trench sidewalls 131a and 131b. Reducing the high aspect ratio of filling area 633 may prevent pinch off from occurring between spacers 650b and 650c during the deposition process before the entire trench 130 may be filled. The filling process may then be followed by an etch-back process to remove the deposited layer 654 of dielectric material from at least the second portion 130b of trench 130, as shown in FIG. 6F. The etch-back process may be carried out by dry etch methods like the ones mentioned above.

Figure 6G:
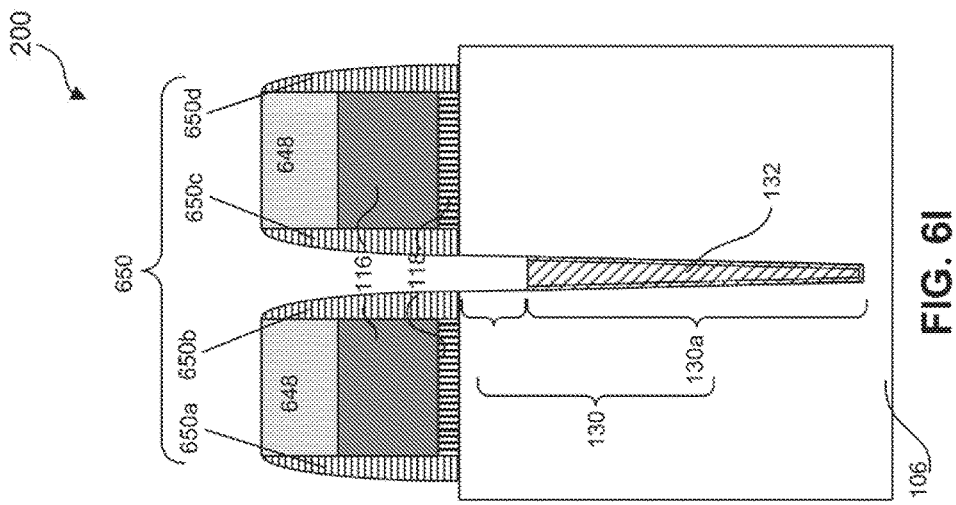
Figure 6H:
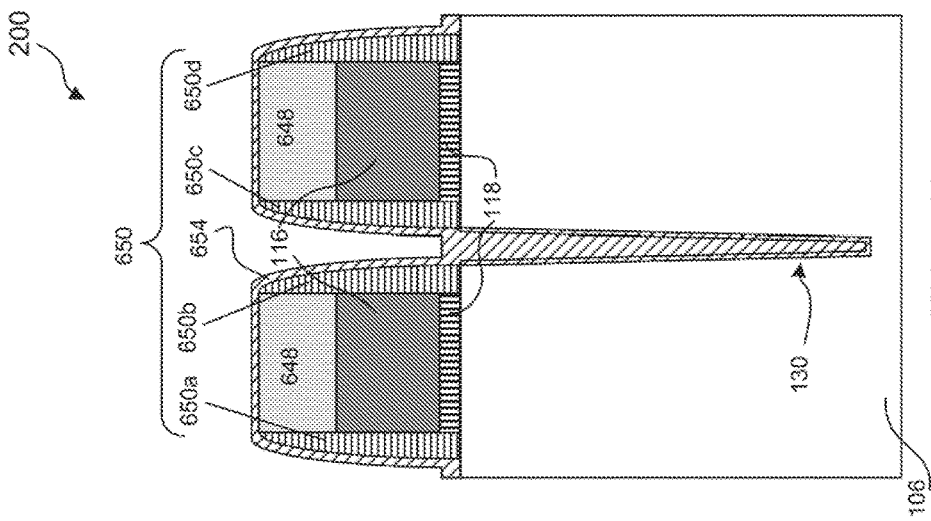
Figure 6I:
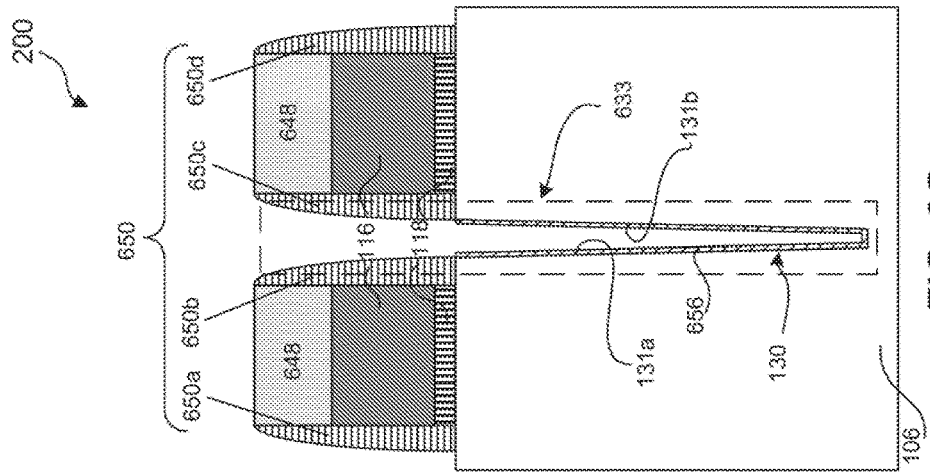

In an alternative approach, first filled portion 132 may be formed as illustrated in FIGS. 6G-6I, according to an embodiment. This approach may also be arranged to have wider spacing between spacers 650b and 650c relative to spacing between sidewalls 131a and 131b of trench 130 for better control of the subsequent filling process. However, in this approach, the spacing between sidewalls 131a and 131b of trench 130 may be reduced by a coating process prior to the filling process, according to an embodiment. Thus, the formation of first filled portion 132 in this approach may involve a coating process, a subsequent filling process followed by an etch-back process. The filling process (as shown in FIG. 6H) and etch-back process (as shown in FIG. 6I) are similar to the processes described above with reference to FIGS. 6E and 6F. Hence, only the coating process is described. The coating process may involve coating sidewalls 131a and 131b of trench 130 with a thin film 656 ("liner 656") of dielectric material such as, but not limited to, silicon oxide or silicon nitride, as shown in FIG. 6G. The material for liner 656 may be the same material that is used in a subsequent filling process for forming first filled portion 132, according to an embodiment. The coating process may be carried out by a deposition process suitable for depositing thin films such as, but not limited to ALD. Alternately, assuming substrate 106 to be Si in an embodiment, the coating process may be carried out by growing silicon oxide directly from sidewalls 131a and 131b using a thermal oxidation process.

FIGS. 6J-6K illustrate cross-sectional views of a partially fabricated IC 200 during formation of second filled portion 134 of trench 130, according to an embodiment. This formation method is similar to the method described above with reference to FIG. 5E-5F. Following the formation of second filled portion 134, hard mask layers 648 and spacers 650 may be removed by any conventional etching processes. Subsequently, doped regions 112 and 114, pocket implants 122, and spacers 126 may be formed to yield IC 200 as shown in FIG. 6L. The methods of forming doped regions 112 and 114, pocket implants 122, and spacer 126 are similar to the ones described above with reference to FIG. 5H. Alternatively, doped regions 112 and 114 and pocket implants 122 may be formed after formation of gate structures 110 as described above with reference to FIG. 6A.

In an alternative embodiment to fabricate IC 200, the fabrication process may involve forming partial gate structures 710 and hard mask layers 648 (as shown in FIG. 7A) instead of gate structures 110 and hard mask layers 648, as shown in FIG. 6A. Partial gate structures 710 may comprise gate dielectric layers 118 and gate layers 716. Gate layers 716 may be similar to gate layers 116 of gate structures 110, except for having vertical dimensions smaller than vertical dimensions of gate layers 116. The partial gate structures 710 with shorter vertical dimensions than gate structures 110 may reduce the high aspect ratio of filling area 633. Thus, the shorter partial gate structures 710 may further help to control the filling process and avoid pinch off from occurring as discussed above with reference to FIGS. 6D and 6G.

After the formation of partial gate structures 710 and hard mask layers 648, IC 200 may be fabricated using the method described with reference to FIGS. 6B-6L, except for the removal of hard mask layers 648, as illustrated in FIG. 7A. Additional processes, such as, but not limited to, the processes illustrated in FIGS. 7B-7F may be performed on IC 200 of FIG. 7A to obtain complete gate structures 770 (as shown in FIG. 7F). Gate structures 770 may include vertical dimensions equal to vertical dimensions of gate structures 110, as shown in FIG. 6A.

FIG. 7B illustrates a deposition of a dielectric layer 760 such that it covers all features and exposed regions on substrate 106, according to an embodiment. The dielectric material of layer 760 may be, for example, silicon oxide or silicon nitride. This deposition may be carried out by any conventional deposition process suitable for dielectric materials such as CVD or ALD. Following the deposition of layer 760, a chemical mechanical polishing (CMP) process may be performed to at least expose top surfaces 648a of hard mask layers 648, as illustrated in FIG. 7C. Subsequently, hard mask layers 648 may be selectively etched without significant etching or removal of underlying gate layers 716, as shown in FIG. 7D. The selective etching may be done by, for example, an RIE process. The etching process may be followed by a deposition process of layer 765 and a removal process to form additional gate layers 717 of FIG. 7F. Layer 765 may be formed by depositing a metal layer, a polySi layer, or any combination thereof using deposition methods such as the ones mentioned above for deposition of metal and polySi. The removal process following the deposition of layer 765 may be performed by, for example, an etch back process, a CMP process, or a patterning process using standard photolithography and etching process, as described above. Formation of additional gate layers 717 may yield complete gate structures 770.

It should be understood that the various layers illustrated during the example fabrication process of IC 200 are not necessarily drawn to scale. In addition, the above description is meant to provide a general overview of select steps involved in forming IC 200 shown in FIG. 2 and that, in actual practice, more features and/or fabrication steps may be performed additionally or alternatively to that described herein to form IC 200, as would be understood by one skilled in the art given the description herein.

Figure 8:
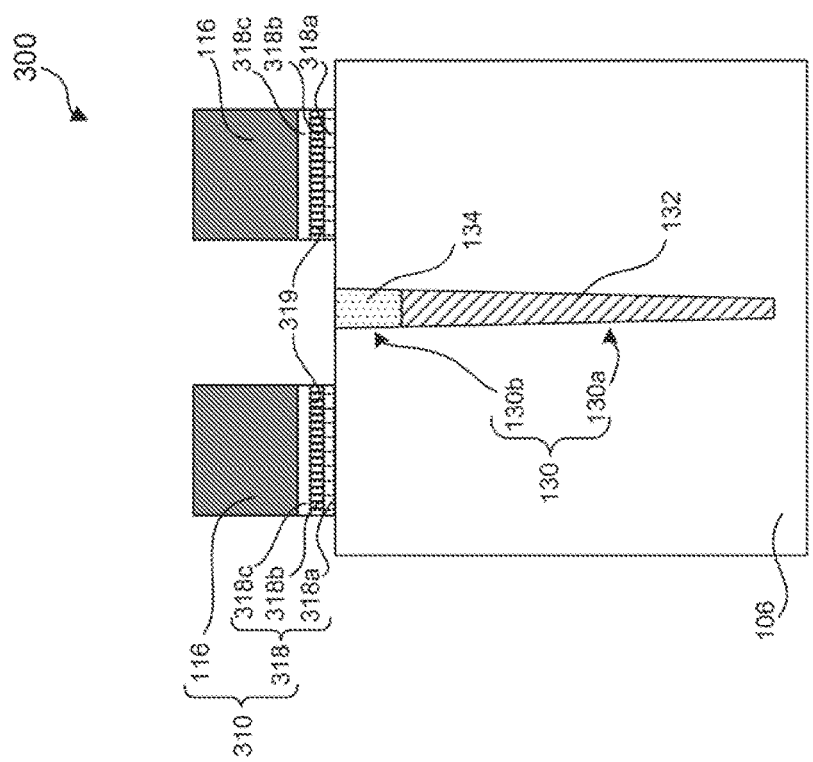
FIG. 8 illustrates a cross-sectional view of a partially fabricated IC including a buried trench, according to an embodiment.

An Example Method for Fabricating an Integrated Circuit According to a Third Embodiment According to an embodiment, IC 300 may be manufactured using a fabrication process similar to the example fabrication process described above for IC 100 with reference to FIGS. 5A-5H. Therefore, only the differences between the example fabrication processes of IC 100 and IC 300 are illustrated in FIG. 8 and discussed below.

Following the formation of second filled portion 134 as described above with reference to FIG. 5F, gate structures 310 (as shown in FIG. 3) may be fabricated, according to an embodiment. The formation of gate structures 310 may comprise formation of stack of layers 318 on substrate 106 followed by formation of gate layers 116 on stack of layers 318. For fabricating stack of layers 318, a first dielectric layer 318a may be deposited on entire top surface 106a of substrate 106 followed by deposition of a charge storing layer 318b on entire surface of first dielectric layer 318a, and subsequent deposition of a second dielectric layer 318c on entire surface of charge storing layer 318b. First and second dielectric layers 318a and 318c and charge storing layer 318b may be formed using conventional deposition processes such as, but not limited to, CVD and ALD. Alternatively, first dielectric layer 318a may be formed by growing, for example, silicon oxide directly from substrate 106 using thermal oxidation, assuming substrate 106 to be Si in this embodiment. Alternatively, second dielectric layer 318c may be formed by growing, for example an oxide layer from a top surface 319 (as shown in FIG. 8) of charge storing layer 318b, assuming charge storing layer 318b to be a nitride layer, using any conventional oxidation process suitable for nitride materials. Gate layer 116 may be formed by depositing a metal or polySi layer using deposition methods such as the ones mentioned above for deposition of metal and polySi. This formation of stack of layers 318 and gate layer 116 may be followed by a patterning and an etching process to define gate structures 310, as shown in FIG. 8. The patterning process may be performed by standard photolithography process and the etching process may be performed by dry etch methods such as the ones mentioned above.

It should be understood that the various layers illustrated during the example fabrication process of IC 300 are not necessarily drawn to scale. In addition, the above description is meant to provide a general overview of select steps involved in forming IC 300 shown in FIG. 3 and that, in actual practice, more features and/or fabrication steps may be performed additionally or alternatively to that described herein to form IC 300, as would be understood by one skilled in the art given the description herein.

An Example Method for Fabricating an Integrated Circuit According to a Fourth Embodiment According to an embodiment, IC 400 may be manufactured using a fabrication process similar to the example fabrication process described above for IC 200 with reference to FIGS. 6A-6L. Therefore, only the differences between the example fabrication processes of IC 200 and IC 400 are illustrated in FIG. 9 and discussed below.

Figure 9:
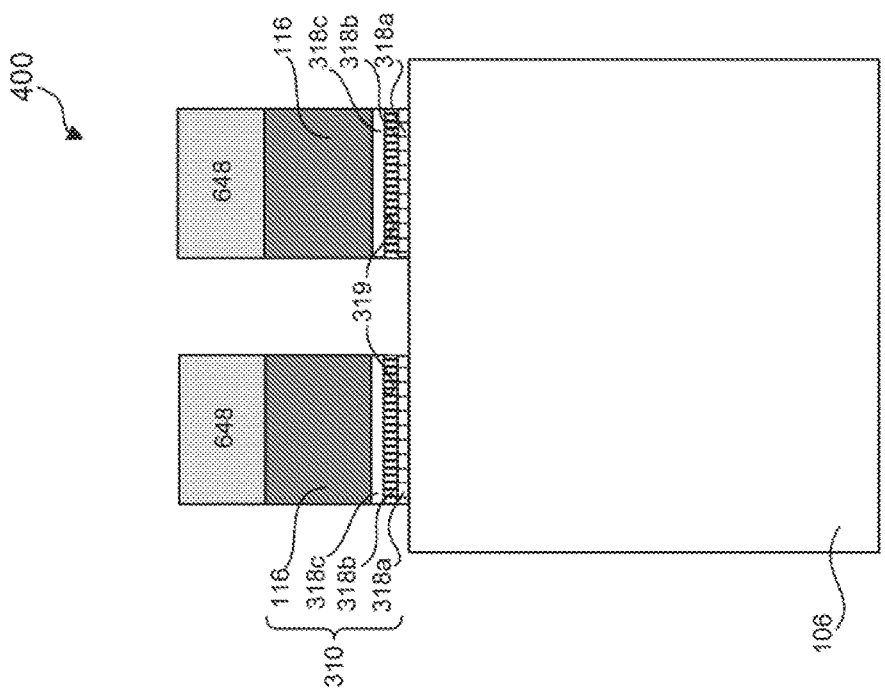
FIG. 9 illustrates a cross-sectional view of a partially fabricated IC, according to an embodiment.

In accordance to an embodiment, gate structures 310 and hard mask layers 648 may be fabricated on substrate 106 as shown in FIG. 9, prior to the formation of spacers 650 as described with reference to FIG. 6B. The method for fabricating gate structures 310 and hard mask layers 648 is similar to the example method described above with reference to FIG. 8.

Alternatively, IC 400 may be manufactured using a fabrication process similar to the example fabrication process described above for IC 200 with reference to FIGS. 7A-7F. The difference between this example fabrication process of IC 200 and IC 400 may be the formation of stack of layers 318 in IC 400 (as method described above with reference to FIG. 8) instead of gate dielectric layer 118.

It should be understood that the various layers illustrated during the example fabrication process of IC 400 are not necessarily drawn to scale. In addition, the above description is meant to provide a general overview of select steps involved in forming IC 400 shown in FIG. 4 and that, in actual practice, many more features and/or fabrication steps may be performed additionally or alternatively to that described herein to form IC 400, as would be understood by one skilled in the art given the description herein.

Figure 10:
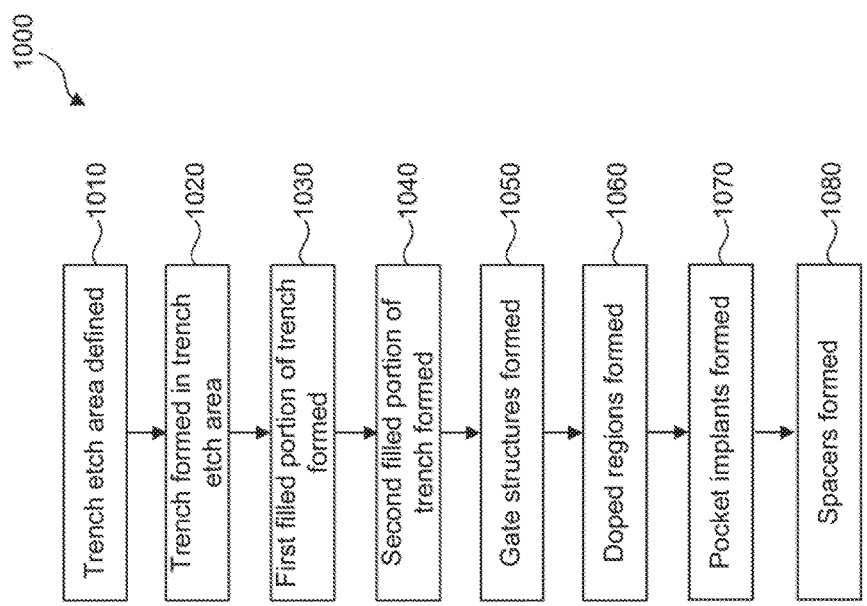
FIG. 10 illustrates a flowchart for a method of fabricating an IC, according to a first embodiment.

Example Steps for Fabricating an Integrated Circuit According to a First Embodiment FIG. 10 illustrates a flowchart for a method of fabricating IC 100 shown in FIG. 1, according to an embodiment. Solely for illustrative purposes, the steps illustrated in FIG. 10 will be described with reference to example fabrication process illustrated in FIGS. 5A-5H.

In step 1010, trench etch area 542 may be defined by patterning of a first hard mask layer 538 and a second hard mask layer 540 on substrate 106, as shown in FIG. 5A. Patterning of first and second hard mask layers 538 and 540 may be performed by standard photolithography and etching processes. First hard mask layer 538 may be disposed on top surface 106a of substrate 106, for example, by growing a thermal oxide such as silicon oxide directly from substrate 106 using thermal oxidation. Second hard mask layer 540 may be disposed on first hard mask layer 540, for example, by depositing a layer of nitride such as silicon nitride using, for example, chemical vapor deposition (CVD) or atomic layer deposition (ALD) method.

In step 1020, trench 130 may be formed in trench etch area 542, as shown in FIG. 5B, by a dry etch process such as, but not limited to, reactive ion etching (RIE) to remove the material of substrate 106, according to an embodiment. The etching process may be performed to selectively etch the material of substrate 106 in trench etch area 542 without significant etching or removal of first and second hard mask layers 538 and 540.

In step 1030, first portion 130a of trench 130 may be filled to form first filled portion 132 by depositing a layer 544 of dielectric material such as silicon oxide or silicon nitride followed by an etch-back process to remove layer 544 from all areas except for first portion 130a, as described above with reference to FIGS. 5C and 5D. The deposition of layer 544 may be performed using, for example, a CVD or an ALD process.

In step 1040, second portion 130b of trench 130 may be filled to form second filled portion 134 by depositing a layer 546 of conductive material such as metals or metal silicides followed by an etch-back process to remove layer 546 from all areas except for second portion 130b, as described above with reference to FIGS. 5E and 5F. The deposition of layer 546 may be performed using, for example, sputtering, thermal evaporation or CVD process. Alternatively, a-Si or polySi may be deposited for layer 546 using conventional deposition methods.

In step 1050, gate structures 110 may be formed (FIG. 5G). The formation of gate structures 110 may involve a deposition of gate dielectric layer 118 on the entire top surface 106a of substrate 106 followed by a deposition of gate layer 116 on the entire surface of gate dielectric layer 118. Gate dielectric layer 118 may be formed by depositing silicon oxide, high-k dielectric, other dielectric material, or any combination thereof using a chemical vapor deposition process. Gate layer 116 may be formed by depositing a metal layer, a polySi layer, or any combination thereof using deposition methods such as the ones mentioned above for deposition of metal and polySi. This formation of gate dielectric layer 118 and gate layer 116 may be followed by a patterning and an etching process to define gate structures 110, as shown in FIG. 5G. The patterning process may be performed by standard photolithography process and the etching process may be performed by dry etch methods such as the ones mentioned above.

In step 1060, doped regions 112 and 114, pocket implants 122, and spacers 126 may be formed (FIG. 5H). Doped regions 112 and 114 may be formed by an ion implantation method. Prior to or subsequent to doped region formation, pocket implants 122 may be formed in step 1070 using an ion implantation process at an angle into substrate 106 to form the pocket implants at a deeper region below gate structures 110 than doped regions 112 and 114, as shown in FIG. 5H. Following the formation of doped regions 112 and 114 and pocket implants 122, spacers 126 may be formed in step 1080 as described above with reference FIG. 5H.

It should be noted that, although the above method description and related figures describe fabricating only one arrangement of trench 130 interposed between adjacent devices 108a and 108b for the sake of simplicity. However, as would be understood by a person of skill in the art based on the description herein, the above steps may be applied to fabricate any number of such arrangements with devices and trenches similar to devices 108 and trench 130, respectively.

Those skilled in the relevant art(s) will recognize that the above method 1000 may additionally or alternatively include any of the steps or sub-steps described above with respect to FIGS. 5A-5H, as well as any of their modifications. Further, the above description of the example method 1000 should not be construed to limit the description of IC 100 described above.

CONCLUSION

It is to be appreciated that the Detailed Description section, and not the Summary and Abstract sections (if any), is intended to be used to interpret the claims. The Summary and Abstract sections (if any) may set forth one or more but not all embodiments of the present disclosure as contemplated by the inventor(s), and thus, are not intended to limit the present disclosure or the appended claims in any way.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof are appropriately performed. Also, alternative embodiments may perform functional blocks, steps, operations, methods, etc. using orderings different than those described herein.

The breadth and scope of the present disclosure should not be limited by any of the above-described embodiments, but should be defined only in accordance with the following claims and their equivalents.

What is claimed is:

1. A method, comprising:
    forming first and second partial gate structures adjacent one another over a substrate, wherein a defined area in the substrate is located between the first and second partial gate structures;
    wherein the first and second partial gate structures have a partial gate layer that has a smaller vertical dimension than a complete gate layer;
    forming a self-aligned trench in the defined area between the first and second partial gate structures;
    filling a first portion of the self-aligned trench with a dielectric material;
    filling a second portion of the self-aligned trench with a conductive material; and
    after filling the first and second portions of the self-aligned trench, forming an additional gate layer over the partial gate layer of the first and second partial gate structures to form gate structures with the complete gate layer.

2. The method of claim 1, wherein forming the first and second partial gate structures comprises forming a dielectric layer over the substrate and forming a partial gate layer over the dielectric layer.

3. The method of claim 1, further comprising forming first and second doped regions for the first and second partial gate structures, wherein the first and second doped regions are substantially in contact with at least a part of the second filled portion of the self-aligned trench.

* * * * *